(12) United States Patent
Yokoi et al.

(10) Patent No.: US 7,989,325 B2
(45) Date of Patent: Aug. 2, 2011

(54) METHOD FOR MANUFACTURING CRYSTALLINE SEMICONDUCTOR FILM AND METHOD FOR MANUFACTURING THIN FILM TRANSISTOR

(75) Inventors: Tomokazu Yokoi, Kanagawa (JP); Ryota Tajima, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/646,373

(22) Filed: Dec. 23, 2009

(65) Prior Publication Data

US 2010/0216285 A1  Aug. 26, 2010

(30) Foreign Application Priority Data

Jan. 13, 2009 (JP) ................................. 2009-005024

(51) Int. Cl.
*H01L 21/20* (2006.01)
*C30B 28/12* (2006.01)

(52) U.S. Cl. ......... 438/479; 438/503; 438/507; 117/108

(58) Field of Classification Search ........................ None
See application file for complete search history.

(56) References Cited

U.S. PATENT DOCUMENTS

| | | | |
|---|---|---|---|
| 4,409,134 A | | 10/1983 | Yamazaki |
| 4,918,028 A | * | 4/1990 | Shirai ............................ 438/488 |
| 5,246,886 A | * | 9/1993 | Sakai et al. ................... 438/488 |
| 5,403,771 A | * | 4/1995 | Nishida et al. .................. 438/97 |
| 5,593,497 A | * | 1/1997 | Matsuyama et al. ............ 117/90 |
| 5,653,802 A | * | 8/1997 | Yamagata ........................ 117/90 |
| 5,739,043 A | * | 4/1998 | Yamamoto ..................... 438/535 |
| 5,766,989 A | | 6/1998 | Maegawa et al. |
| 5,904,770 A | * | 5/1999 | Ohtani et al. .................. 117/103 |
| 6,271,062 B1 | | 8/2001 | Nakata et al. |
| 7,611,930 B2 | | 11/2009 | Yamazaki et al. |
| 7,833,845 B2 | | 11/2010 | Yamazaki et al. |
| 2003/0153165 A1 | * | 8/2003 | Kondo et al. .................. 438/478 |
| 2005/0012097 A1 | | 1/2005 | Yamazaki |
| 2007/0087492 A1 | * | 4/2007 | Yamanaka ..................... 438/166 |
| 2009/0047759 A1 | | 2/2009 | Yamazaki et al. |
| 2009/0047761 A1 | | 2/2009 | Yamazaki et al. |
| 2009/0072237 A1 | | 3/2009 | Yamazaki et al. |
| 2009/0142909 A1 | | 6/2009 | Jinbo et al. |
| 2009/0321737 A1 | | 12/2009 | Isa et al. |

FOREIGN PATENT DOCUMENTS

| | | |
|---|---|---|
| JP | 2003-037278 | 2/2003 |
| JP | 2008-124392 | 5/2008 |

* cited by examiner

*Primary Examiner* — Scott B Geyer
(74) *Attorney, Agent, or Firm* — Nixon Peabody LLP; Jeffrey L. Costellia

(57) ABSTRACT

A crystalline semiconductor film is manufactured by a first step in which a crystalline semiconductor film is formed on and in contact with an insulating film and a second step in which the crystalline semiconductor film is grown in a condition where a generation frequency of nuclei is lower than in the first step. The second step is conducted in a condition where a flow ratio of a semiconductor material gas to a deposition gas is lower than in the first step. Thus, a crystalline semiconductor film whose crystal grains are large and uniform can be obtained and plasma damage to a base film of the crystalline semiconductor film can be reduced compared with a crystalline semiconductor film in a conventional method.

22 Claims, 22 Drawing Sheets

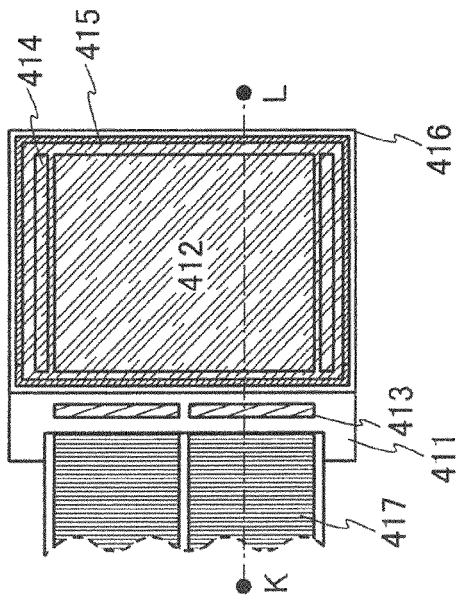
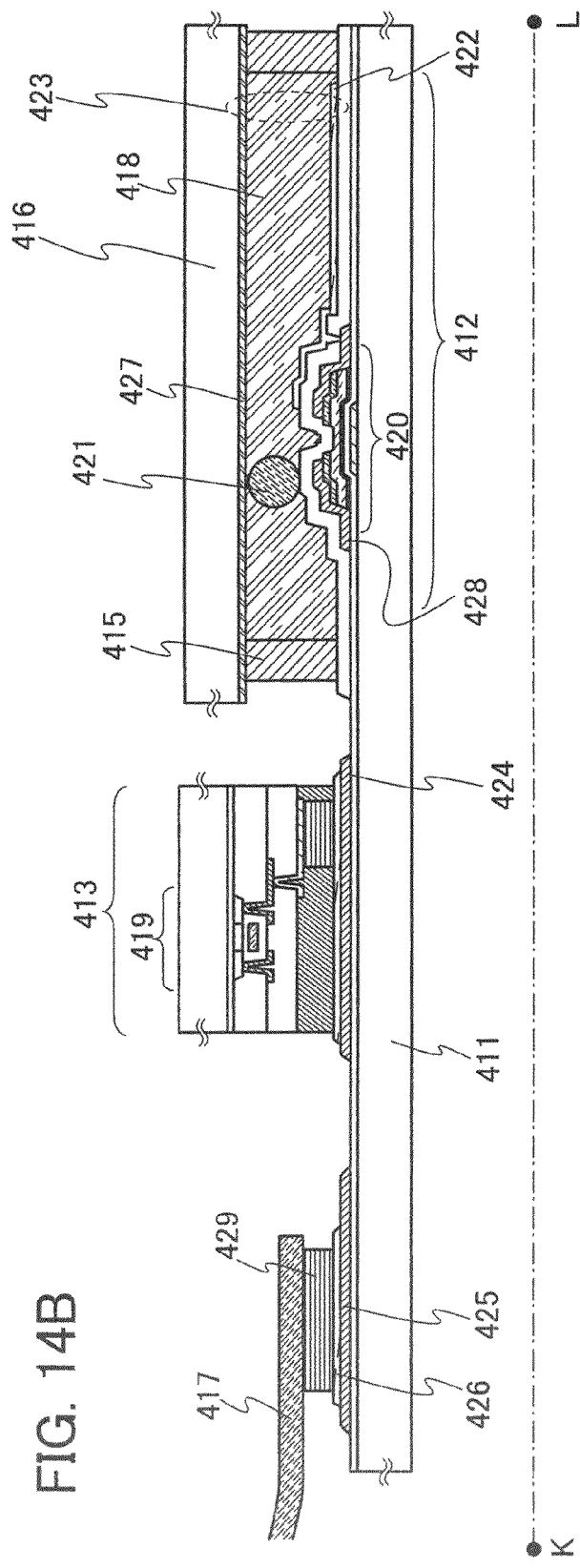
FIG. 14A
FIG. 14B

500nm

500nm

500nm

500nm

METHOD FOR MANUFACTURING CRYSTALLINE SEMICONDUCTOR FILM AND METHOD FOR MANUFACTURING THIN FILM TRANSISTOR

BACKGROUND OF THE INVENTION

1. Field of the Invention

The present invention relates to a manufacturing method of a crystalline semiconductor film and a manufacturing method of a thin film transistor. Further, the present invention relates to a semiconductor device such as a display device using them.

2. Description of the Related Art

In recent years, a thin film transistor including a semiconductor thin film (with a thickness of several nanometers to several hundreds nanometers, approximately) over a substrate having an insulating surface (e.g., a glass substrate) has been attracting attention. Thin film transistors are widely used for ICs (integrated circuits) and electronic devices such as electro-optical devices. In particular, thin film transistors are rapidly developed as switching elements of image display devices typified by liquid crystal display devices and the like. In an image display device such as a liquid crystal display device, a thin film transistor using an amorphous semiconductor film or a thin film transistor using a polycrystalline semiconductor film is mainly used as a switching element. Further, a thin film transistor using a microcrystalline semiconductor film is known (for example, see Patent Document 1).

It has been known that a deposition method composed of a plurality of levels (a plurality of steps) in which a condition at an earlier stage of deposition and a condition at a later stage of deposition are different is efficient to form a microcrystalline semiconductor film with a favorable crystallinity. This is because at the earlier stage of deposition, a material and crystallinity of a surface over which a crystalline semiconductor is to be formed are likely to have an influence on the crystalline semiconductor film, and at the later stage of deposition, the material and the crystallinity of the crystalline semiconductor film deposited at the earlier stage of deposition are likely to have an influence on the crystalline semiconductor film. The patent document 2 discloses an example of techniques to form a microcrystalline semiconductor film by such a deposition method composed of a plurality of levels (a plurality of steps). In the patent document 2, a deposition rate is improved by increasing a dilution ratio of hydrogen to a source gas (a deposition gas) and electric power for generating plasma at the earlier stage of deposition and by decreasing a dilution ratio of hydrogen to a source gas (a deposition gas) and electric power for generating plasma at the later stage of deposition.

[Reference]
[Patent Document]
[Patent Document 1] U.S. Pat. No. 4,409,134
[Patent Document 2] Japanese Patent Laid-Open No. 2003-037278

SUMMARY OF THE INVENTION

Differences of characteristics of a microcrystalline semiconductor film due to a flow ratio of a deposition gas to a dilution gas are discussed.

In a condition where a flow ratio of a deposition gas to a dilution gas is high (a condition where a dilution ratio is low), crystal nuclei are generated easily (a semiconductor material is deposited easily). Thus, plasma damage to a surface over which a microcrystalline semiconductor is to be formed can be suppressed and uniformity of grain sizes can be high. However, many grain boundaries exist in a formed microcrystalline semiconductor film because crystal grain sizes are small.

On the other hand, in a condition where a flow ratio of a deposition gas to a dilution gas is low (a condition where a dilution ratio is high), crystal nuclei are difficult to generate (a semiconductor material is difficult to deposit). Thus, plasma damage to a surface over which a microcrystalline semiconductor film is to be formed is relatively large and the grain sizes are nonuniform. However, the number of grain boundaries in the microcrystalline semiconductor film can be reduced because the crystal grain sizes are large.

It is an object of one embodiment of the present invention to provide a method for manufacturing a crystalline semiconductor film in which the grain sizes are large, the uniformity of the grain sizes is high, plasma damage to a surface over which the crystalline semiconductor film is to be formed is small.

Further, it is another object of one embodiment of the present invention to provide a method for manufacturing a thin film transistor in which generation of defects are suppressed at an interface between a gate insulating film and a microcrystalline semiconductor film or/and in the gate insulating film. When plasma damage is caused on the gate insulating film, a defect (an interface-trap) is generated at an interface between the gate insulating film and the microcrystalline semiconductor film. Further, when the plasma damage is caused in the gate insulating film, a defect (an in-film trap) is generated in the gate insulating film. These defects become a cause of a threshold voltage shift in the thin film transistor. It is another object of one embodiment of the present invention to provide a thin film transistor in which plasma damage to a surface over which a microcrystalline semiconductor film is to be formed is small.

One embodiment of the present invention is a method for manufacturing a crystalline semiconductor film including a plurality of steps in which a condition where a flow ratio of a deposition gas to a dilution gas is high (a dilution ratio is low, preferably a dilution gas: a deposition gas=40:1 to 50:1) and a condition where a flow ratio of a deposition gas to a dilution gas is low (a dilution ratio is high, preferably a dilution gas: deposition gas=80:1 to 200:1) are used, and a flow ratio of the deposition gas at the later stage of deposition is lower than a flow ratio of the deposition gas at the earlier stage of deposition.

One embodiment of the present invention is a method for manufacturing a crystalline semiconductor film by a plasma CVD method including: a first step of forming crystal nuclei densely over an insulating surface by making a flow ratio of a deposition gas to a dilution gas high (preferably a dilution gas: a deposition gas=40:1 to 50:1) in order that the crystal nuclei are generated easily; and a second step of growing the crystalline semiconductor film using the crystal nuclei as seeds by making the flow ratio of the deposition gas to the dilution gas lower than that of the deposition gas to the dilution gas in the first step (preferably a dilution gas: a deposition gas=80:1 to 200:1) in order that the crystal nuclei are difficult to generate.

One object of the method for manufacturing a crystalline semiconductor film described above is to suppress plasma damage to a surface over which the crystalline semiconductor film is to be formed. Therefore, when plasma is used in part of or all of a manufacturing process, the above-mentioned method for manufacturing a crystalline semiconductor film is preferably employed. A plasma CVD method is a typical technique of using plasma in part of or all of the manufacturing process.

One embodiment of the present invention is a method for manufacturing a crystalline semiconductor film including: a first step of forming crystal nuclei of a semiconductor, which are in contact with an insulating film, using a deposition gas and a dilution gas by a plasma CVD method in a condition where a deposition rate is 5 nm/min or more; and a second step of growing the crystalline semiconductor film by a plasma CVD method in a condition where a period of an initial stage of deposition is longer than a period of an initial stage of deposition in the first step.

One embodiment of the present invention is a method for manufacturing a crystalline semiconductor film including: a first step of forming crystal nuclei of a semiconductor, which are in contact with an insulating film, using a deposition gas and a dilution gas by a plasma CVD method in a condition where a deposition rate is 5 nm/min or more; and a second step of growing the crystalline semiconductor film by a plasma CVD method in a condition where a flow ratio of the dilution gas to the deposition gas is higher than that of the dilution gas to the deposition gas in the first step.

In one embodiment of the present invention with the above structure, a period of an initial stage of deposition in the first step is preferably 1 minute or more. A period of an initial stage of deposition in the second step is preferably 5 minutes or more. Further, it is more preferable that the period of an initial stage of deposition in the first step be 1 minute or more and the period of an initial stage of deposition in the second step be 5 minutes or more.

Here, a period of an initial stage of deposition refers to a period of time when a deposition rate with respect to a flow rate of a deposition gas is extremely low, which is observed at the beginning of deposition onto a substrate. The period of an initial stage of deposition is also referred to as incubation time.

Further, it is particularly preferable that the above method for manufacturing a crystalline semiconductor film be applied to a bottom-gate thin film transistor. By applying the above method for manufacturing a crystalline semiconductor film to manufacture of a bottom-gate thin film transistor, a bottom-gate thin film transistor can be manufactured which has fewer defects at an interface between a gate insulating film and a crystalline semiconductor film or/and in the gate insulating film. Therefore, one embodiment of the present invention is a method for manufacturing a thin film transistor in which a gate electrode is formed, a gate insulating film is formed to cover the gate electrode, and a crystalline semiconductor film is formed on and in contact with the gate insulating film by the above method for manufacturing a crystalline semiconductor film.

For the above method for manufacturing a crystalline semiconductor film or a thin film transistor, the insulating film over which the crystalline semiconductor film is to be formed is preferably a silicon oxide film.

According to one embodiment of the present invention, a crystalline semiconductor film in which crystal grain sizes are large and uniformity of the grain sizes is high compared to the conventional one can be manufactured while plasma damage to a surface over which the crystalline semiconductor film is to be formed is suppressed. In such a crystalline semiconductor film, carrier mobility is high and on-current is large.

Further, according to one embodiment of the present invention, a bottom-gate thin film transistor can be manufactured which has fewer defects at an interface between a gate insulating film and a crystalline semiconductor film or/and in the gate insulating film. In particular, by reducing defects at the interface between the gate insulating film and the crystalline semiconductor film, a thin film transistor in which an amount of the threshold voltage shift is small can be manufactured.

BRIEF DESCRIPTION OF THE DRAWINGS

In the accompanying drawings:
FIGS. 14A and 14B are a top view and a cross-sectional view, respectively, illustrating a liquid crystal display panel.

DETAILED DESCRIPTION OF THE INVENTION

Figure 1A:
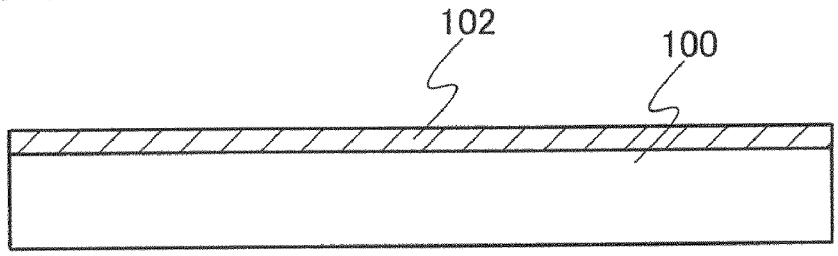
FIGS. 1A to 1D are views illustrating a deposition method of a crystalline semiconductor film.

Hereinafter, embodiments of the present invention are described in detail with reference to the accompanying drawings. The present invention is not limited to the description given below. It is easily understood by those skilled in the art that modes and details disclosed herein can be modified in various ways without departing from the purpose and the scope of the present invention. Therefore, the present invention is not construed as being limited to description of the embodiments given below. In description with reference to the drawings, the same reference numerals are used in common for the same portions in different drawings. Further, in some cases, the same hatching patterns are applied to similar parts, and the similar parts are not designated by reference numerals.

Embodiment 1

In this embodiment, a method for manufacturing a crystalline semiconductor film is described with reference to accompanying drawings. Here, as one example of a crystalline semiconductor film, crystalline silicon is used.

First, a substrate 100 is prepared. The substrate 100 is not limited to a substrate formed of a particular material as long as the substrate 100 has heat resistance and chemical resistance that can withstand formation of each thin film (e.g., a thin film of crystalline silicon) formed over the substrate 100. As the substrate 100, for example, a glass substrate, a quartz substrate, a stainless steel substrate, and a silicon substrate are given.

Next, an insulating film 102 is formed over the substrate 100 (see FIG. 1A). Here, the insulating film 102 is preferably a silicon oxide film. Note that the insulating film 102 does not need to be provided in the case where there is no particular necessity for it.

Next, a crystalline semiconductor film is formed over the insulating film 102 by a method using plasma. As the method using plasma, for example, a plasma CVD method is given. The crystalline semiconductor film is formed in a two-step deposition condition. In the two-step deposition condition in this embodiment, a condition in the earlier stage of deposition and a condition in the later stage of deposition are referred to as a first condition and a second condition, respectively.

First, crystal nuclei are generated over the insulating film 102 in the first condition. The first condition is a condition where a flow ratio of a deposition gas to a dilution gas is high (preferably, a dilution gas: a deposition gas=40:1 to 50:1), generation frequency of crystal nuclei is high, and crystal growth is fast. In the first condition, a deposition rate is preferably 5 nm/min or more. Alternatively, a period of an initial stage of deposition is preferably 1 minute or more. Further, alternatively, the first condition is preferably a condition where a deposition rate is 5 nm/min or more and a period of an initial stage of deposition is 1 minute or more. In the first condition described above, deposition occurs easily in the earlier stage of deposition, a period of time when the insulating film 102 is exposed is shorter, and a period of time when the insulating film 102 is exposed to plasma is shorter. Thus, charge accumulation onto the insulating film 102 is prevented and plasma damage to the interface between the insulating film 102 and the crystalline semiconductor film can be avoided. Therefore, a trap level can be prevented from being generated at the interface between the insulating film 102 and the crystalline semiconductor film formed over the insulating film 102. In addition, plasma damage in the insulating film 102 can be prevented.

In the first condition, specifically, the ratio of the flow rate of the dilution gas (e.g., hydrogen) to the flow rate of the deposition gas (e.g., silane) may be set to 10:1 to 100:1 (preferably 40:1 to 50:1), and a pressure in a reaction chamber may be set to 1 Pa to 101325 Pa (i.e. atmospheric pressure). A substrate temperature may be in the range from room temperature to a temperature at which the substrate is not damaged or changed in quality. A high-frequency electric field which generates plasma may be approximately 400 kHz to 2.45 GHz (preferably 13 MHz to 100 MHz). Note that a treatment time in the first condition may be a period of time from the start of the treatment to just before the time when deposited material comes to have a form of a film. For example, as in Example 1 described later, in the case where a flow rate of silane, a flow rate of hydrogen, a pressure in a reaction chamber, and a substrate temperature are set to 10 sccm, 400 sccm, 100 Pa, and 280° C., respectively, and an RF power supply of 60 MHz is used, the treatment time in the first condition may be 10 to 20 seconds. In the case where the flow rate of silane, the flow rate of hydrogen, the pressure in a reaction chamber, and the substrate temperature are set to 8 sccm, 400 sccm, 100 Pa, and 280° C., respectively, and the RF power supply of 60 MHz is used, the treatment time in the first condition may be 20 to 30 seconds.

Figure 1B:
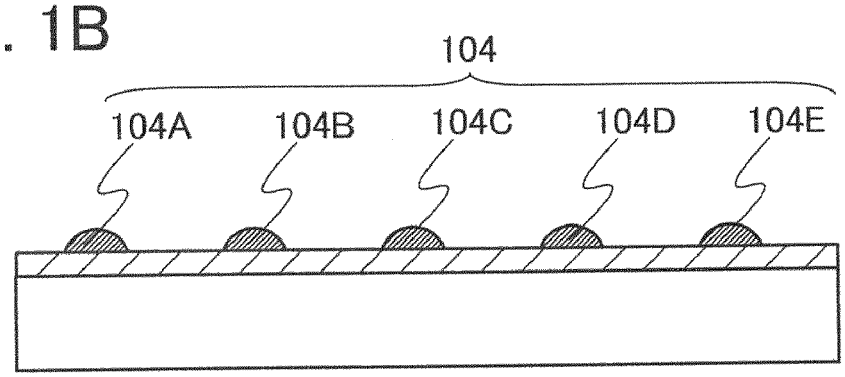

In the first condition, as crystal nuclei 104 (crystal nuclei 104A to 104E), crystal nuclei which have almost or substantially uniform grain sizes are formed at almost or substantially regular intervals over the insulating film 102 (see FIG. 1B).

Figure 1C:
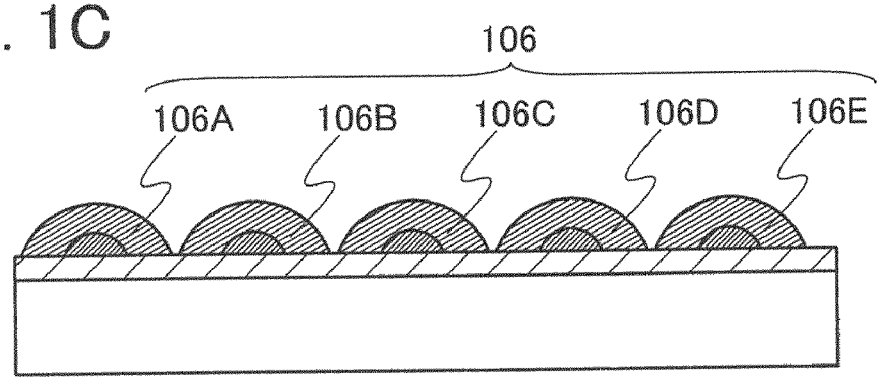

By applying the second condition in a state where the crystal nuclei 104 are formed in the manner described above, the crystal nuclei 104 are grown. The crystal nuclei 104 are grown and the grain sizes are increased to form crystal grains 106 (crystal grains 106A to 106E) (see FIG. 1C). The second condition is a condition where the flow rate of the deposition gas is low and generation frequency of crystal nuclei is low. Since the generation frequency of crystal nuclei is low in the second condition, new nuclei are difficult to generate, for example, in spaces between crystal nuclei formed in the first condition, crystal nuclei whose crystal grain sizes are small can be prevented from being generated, and the crystal grain sizes can be prevented from varying. Further, the crystal nuclei 104 are formed almost all over the insulating film 102 in the first condition, there is no necessity for considering plasma damage to the insulating film 102.

In the second condition, specifically, the flow ratio of the flow rate of the dilution gas (e.g., hydrogen) to the flow rate of the deposition gas (e.g., silane) may be set to 50:1 to 1000:1 (preferably 80:1 to 200:1), and a pressure in a reaction chamber may be set to 1 Pa to 101325 Pa (i.e., atmospheric pressure). A substrate temperature may be in the range from room temperature to a temperature at which a substrate is not damaged or changed in quality. A high-frequency electric field which generates plasma may be approximately 400 kHz to 2.45 GHz (preferably 13 MHz to 100 MHz). Note that a treatment time in the second condition may be a period of time until the film comes to have a desired thickness.

Figure 1D:
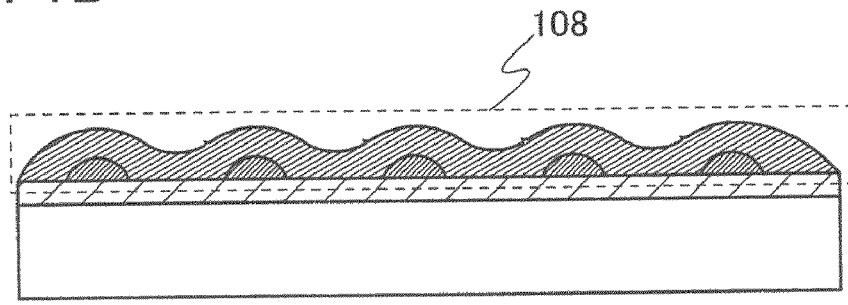

The crystal grains 106 are further grown in the second condition to form a crystalline semiconductor film 108 (see FIG. 1D).

Here, a mechanism from generation of crystal nuclei to crystal growth in the case where a crystalline semiconductor film is deposited in a conventional one-step deposition is described with reference to accompanying drawings. FIGS. 2A to 2D are schematic views when a crystalline semiconductor film is formed by applying only the first condition. FIGS. 3A to 3D are schematic views when a crystalline semiconductor film is formed by applying only the second condition.

Figure 2A:
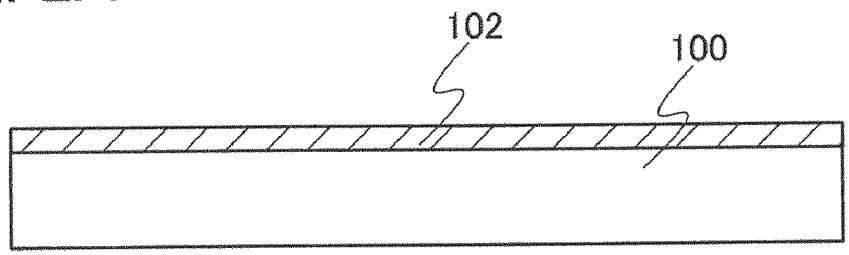
FIGS. 2A to 2D are views illustrating a deposition method of a crystalline semiconductor film.

In FIGS. 2A to 2D, as in FIGS. 1A to 1D, the substrate 100 over which the insulating film 102 is formed is prepared (see FIG. 2A).

Figure 2B:
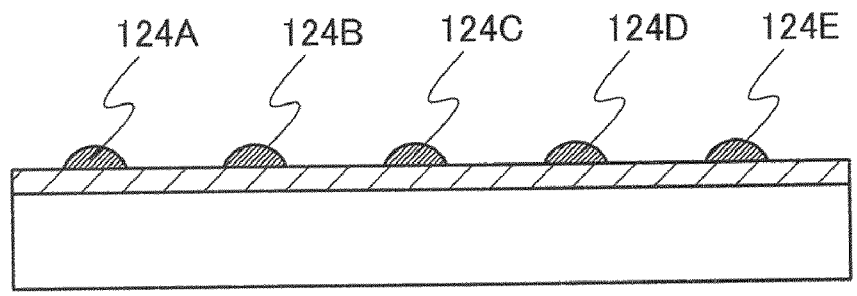
Figure 2C:
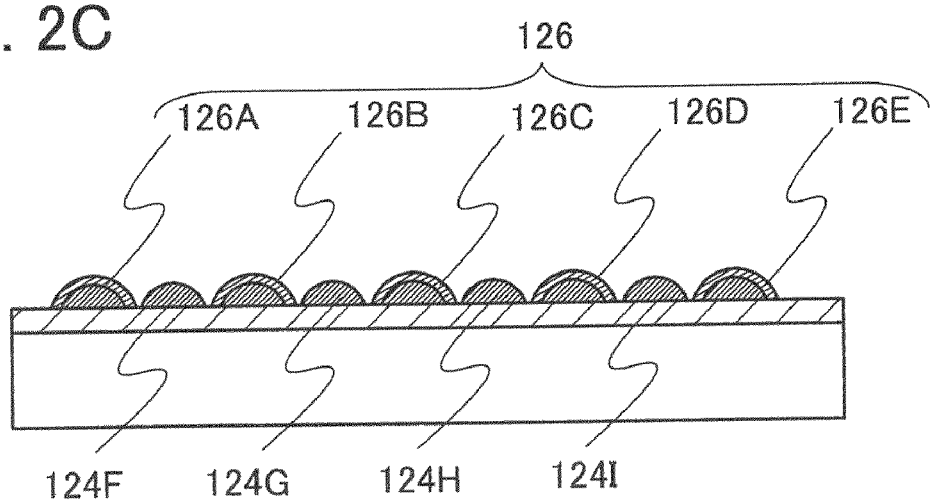
Figure 2D:
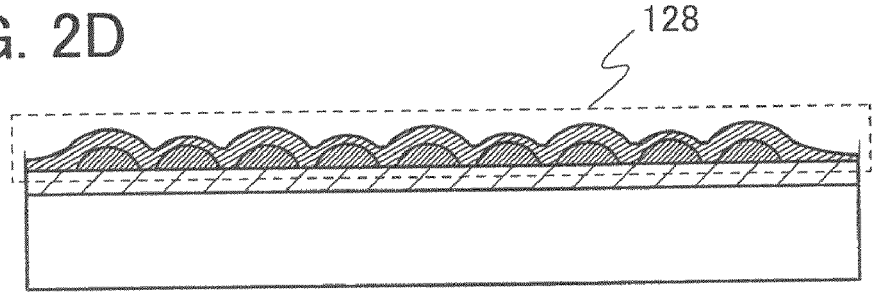

Next, in the first condition, crystal nuclei 124A to 124E are formed almost or substantially uniformly over the insulating film 102 (see FIG. 2B).

In FIGS. 2A to 2D, after the formation of the crystal nuclei 124A to 124E, the crystalline semiconductor film is formed in the first condition continuously. When deposition is conducted in the first condition continuously after the formation of the crystal nuclei 124A to 124E in this manner, not only growth of the crystal nuclei 124A to 124E but also generation of nuclei between the crystal nuclei 124A to 124E is further carried out. Thus, when the crystal nuclei 124A to 124E are grown to form crystal grains 126 (crystal grains 126A to 126E), crystal nuclei 124F to 124I are generated in spaces between the crystal grains 126 and the like at the same time (see FIG. 2C). This is because the generation frequency of nuclei of the first condition is high. After that, a deposition process of the crystalline semiconductor film is finished (see FIG. 2D). In this manner, a crystalline semiconductor film 128 is formed.

In the crystalline semiconductor film 128 formed only using the first condition as in FIGS. 2A to 2D, grain sizes of crystal grains are small. In such a crystalline semiconductor film, many grain boundaries are included, and thus carrier mobility is difficult to improve.

Next, the case of applying only the second condition is described. In FIGS. 3A to 3D, as in FIGS. 1A to 1D and FIGS. 2A to 2D, the substrate 100 over which the insulating film 102 is formed is prepared (see FIG. 3A).

Figure 3A:
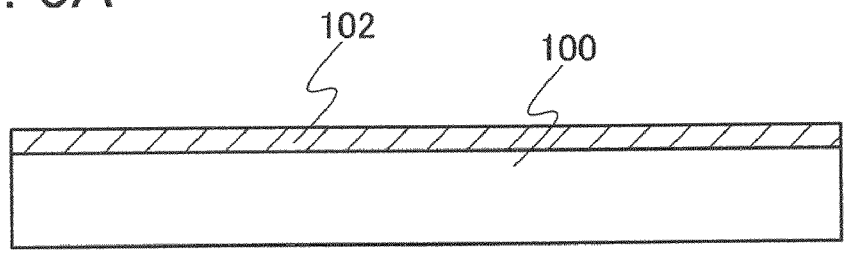
FIGS. 3A to 3D are views illustrating a deposition method of a crystalline semiconductor film.
Figure 3B:
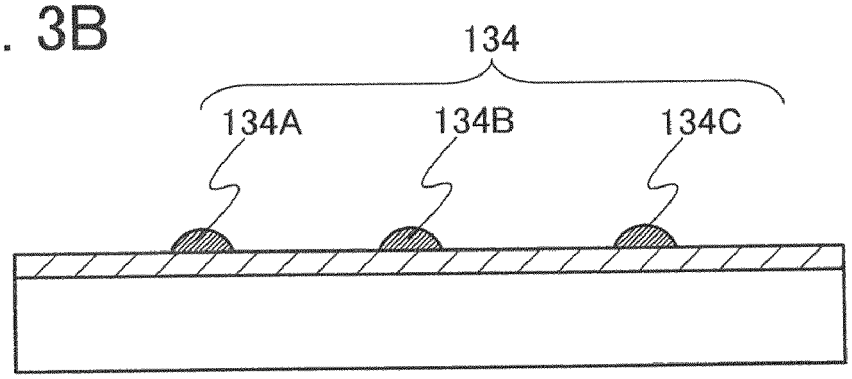
Figure 3C:
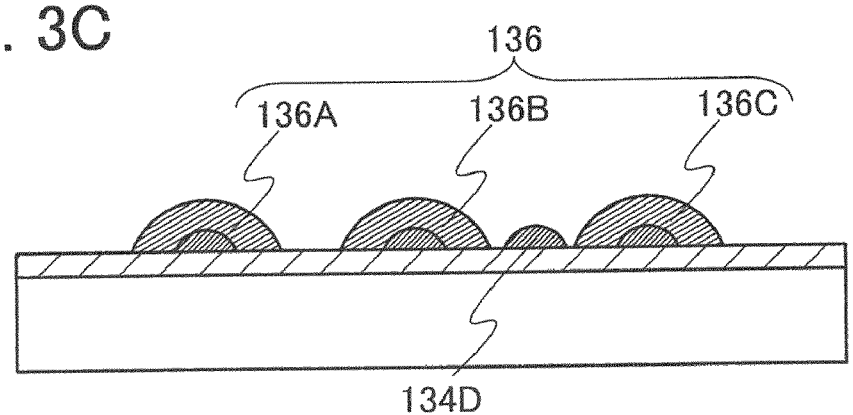
Figure 3D:
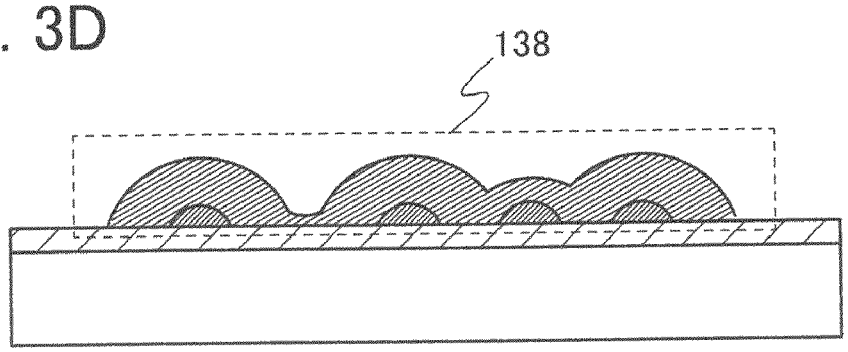

Next, in the second condition, crystal nuclei 134 (crystal nuclei 134A to 134C) are generated (see FIG. 3B). The number of crystal nuclei formed at this time is smaller than that of the crystal nuclei formed in FIGS. 2A to 2D. This is because the generation frequency of nuclei of the second condition is low. Therefore, a large part of the insulating film 102 is exposed to plasma for a long time and thus, plasma damage caused in the insulating film 102 is more serious than in FIGS. 1A to 1D and in FIGS. 2A to 2D.

After the formation of the crystal nuclei 134A to 134C in a manner described above, a crystalline semiconductor film is formed in the second condition continuously. Then, when the crystal nuclei 134A to 134C are grown to form crystal grains 136 (crystal grains 136A to 136C), crystal nucleus 134D is generated in a space between these crystal grains (see FIG. 3C) and the like. After that, the crystal grains 136 and crystal nucleus 134D are grown, and a deposition process of the crystalline semiconductor film is finished (see FIG. 3D). In this manner, a crystalline semiconductor film 138 is formed.

In the crystalline semiconductor film 138 formed only using the second condition as in FIGS. 3A to 3D, both grains each having a large grain size and grains each having a small grain size exist, and the grain sizes are not uniform. Thus, carrier mobility is difficult to improve. Further, the deposition rate is slow and throughput is low.

Furthermore, the period of time when the insulating film 102 or the substrate 100 is exposed to plasma is longer in the deposition using only the second condition than in the deposition using only the first condition and in the deposition using both the first condition and the second condition; therefore, plasma damage caused in the insulating film 102 or the substrate 100 is serious. In addition, the deposition rate is slow and throughput is low.

As described above, when a crystalline semiconductor film is formed using only the first condition or the second condition, a semiconductor film in which the grain sizes are uniform and large is difficult to deposit. Therefore, a semiconductor film with high carrier mobility is difficult to form. Accordingly, a deposition method of one embodiment of the present invention is useful.

By applying the above-mentioned deposition method, a crystalline semiconductor film in which the uniformity is high and the variation in electric characteristics is reduced can be formed.

Further, plasma damage to the insulating film, which serves as a base film or the substrate, can be reduced.

Furthermore, in the second condition, there is an advantage that the average of crystal grain sizes is likely to be large, in particular, grain sizes of crystal grains near the interface between the crystalline semiconductor film and the insulating film serving as a base film is likely to be large.

Note that the case of depositing silicon is described in this embodiment, the present invention is not limited to this. This embodiment of the present invention can be applied to other semiconductor materials such as germanium. Further, the application range is not limited to a semiconductor material. This embodiment of the present invention can be applied to various cases of manufacturing a crystalline thin film in which the grain sizes are uniform and large.

Embodiment 2

In this embodiment, a method for manufacturing a thin film transistor, to which the method for manufacturing the crystalline semiconductor film described in Embodiment 1 is applied, is described with reference to drawings.

Figure 4:
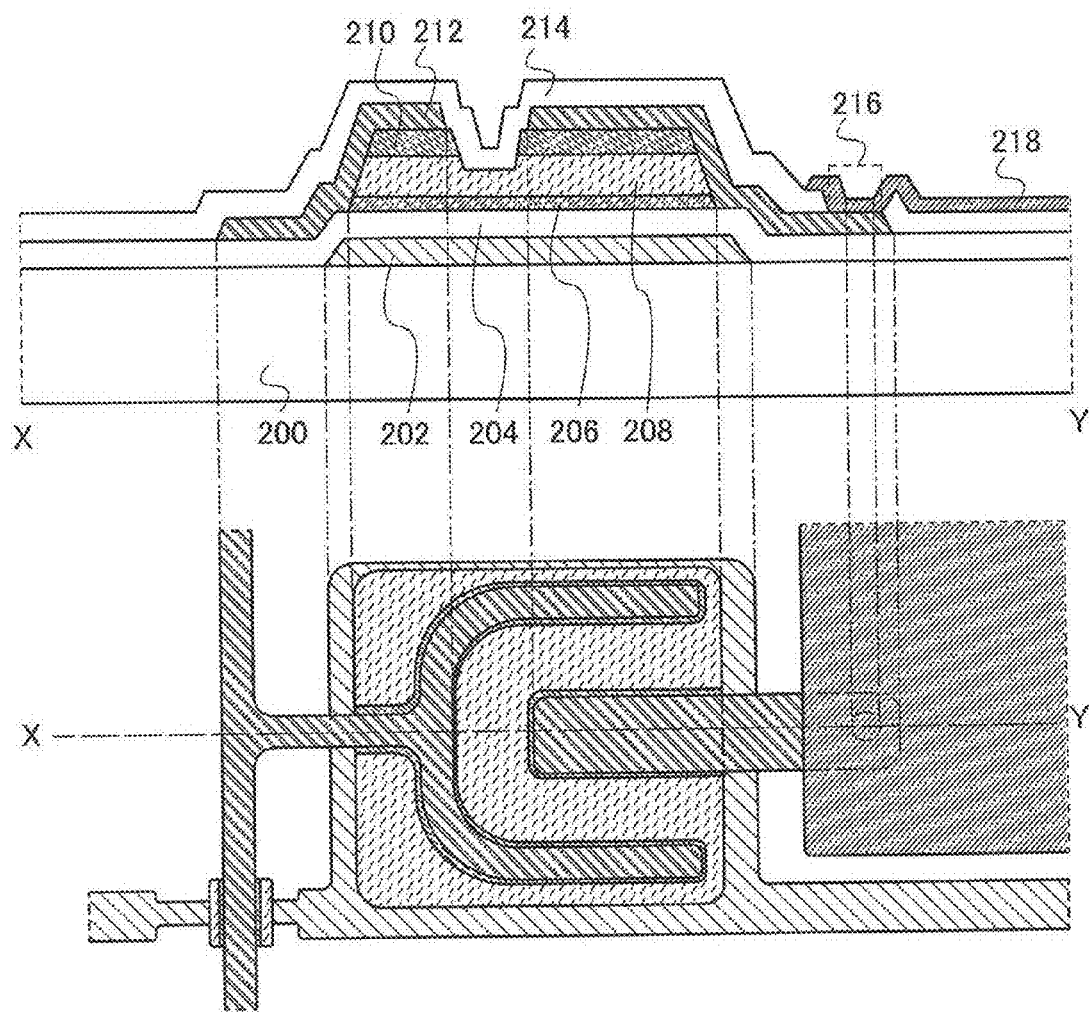
FIG. 4 is a view illustrating an example of a structure of a thin film transistor.

FIG. 4 illustrates an example of a top view and a cross-sectional view of a thin film transistor of this embodiment. The thin film transistor illustrated in FIG. 4 includes a gate electrode layer 202 over a substrate 200, a gate insulating layer 204 covering the gate electrode layer 202, a crystalline semiconductor layer 206 over the gate insulating layer 204, an amorphous semiconductor layer 208 over the crystalline semiconductor layer 206, a source and a drain regions 210 over part of the amorphous semiconductor layer 208, a source and a drain electrode layers 212 over the source and the drain regions 210, and an insulating layer 214 over the source and the drain electrode layers 212. Each layer is patterned into a desired shape. The amorphous semiconductor layer 208 serves as a buffer layer, which improves resistance to voltage and prevents elements from entering the crystalline semiconductor layer. The insulating layer 214 serves as a protective layer.

The thin film transistor illustrated in FIG. 4 is, for example, a pixel transistor which is provided in matrix for a liquid crystal display device (a liquid crystal display panel). One of the source and the drain electrodes of the thin film transistor is connected to a source wiring and the other of the source and the drain electrodes is connected to a pixel electrode layer 218 through an opening portion 216 formed in the insulating layer 214.

Note that in FIG. 4, one of the source and the drain electrodes is provided so as to have a shape of surrounding the other of the source and the drain electrodes in a U shape (a reversed C shape or a horseshoe shape). By providing a U-shaped (a reversed C shape or a horseshoe shape) thin film transistor, the channel width of the thin film transistor can be increased and sufficient on current can flow. In addition, variation in electric characteristics can be reduced. Further, reliability of the thin film transistor can be increased. However, the present invention is not limited to this example, and the thin film transistor is not necessarily U-shaped (a reversed C shape or a horseshoe shape).

Next, a method for manufacturing the thin film transistor illustrated in FIG. 4 is described with reference to drawings. Note that an n-channel thin film transistor having a crystalline semiconductor has field-effect mobility higher than a p-channel thin film transistor having a crystalline semiconductor. Further, when all thin film transistors formed over the same substrate have the same polarity, the number of manufacturing steps can be reduced. Therefore, here, a method for manu-facturing an n-channel thin film transistor is described. However, the present invention is not limited to this example, and the thin film transistor may be p-channel.

First, the gate electrode layer 202 is formed over the substrate 200. As the substrate 200, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless steel alloy or the like with the surface provided with an insulating layer may be used. That is, a substrate having an insulating surface is used as the substrate 200. When the substrate 200 is a mother glass, the substrate may have any size of from the first generation (e.g., 320 mm×400 mm) to the tenth generation (e.g., 2950 mm×3400 mm), and the like.

The gate electrode layer 202 can be formed using a metal material such as molybdenum, titanium, chromium, tantalum, tungsten, aluminum, copper, neodymium, or scandium or an alloy material which includes any of these materials as a main component. In the case of using aluminum, in the case where an Al—Ta alloy in which aluminum is alloyed with tantalum added thereto is used, generation of hillocks can be suppressed. Alternatively, in the case where an Al—Nd alloy in which aluminum is alloyed with neodymium added thereto is used, not only hillocks can be suppressed, but also a wiring with low resistance can be formed. Alternatively, a semiconductor layer typified by polycrystalline silicon doped with an impurity element such as phosphorus, or an AgPdCu alloy film may be used. The gate electrode layer 202 may have either a single-layer structure or a stacked-layer structure. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, electric resistance can be reduced and a metal element from the metal layer can be prevented from diffusing into the semiconductor layer. Alternatively, a two-layer structure including a titanium nitride layer and a molybdenum layer, or a three-layer structure including a tungsten layer (thickness: about 50 nm), an alloy layer of aluminum and silicon (thickness: about 500 nm), and a titanium nitride layer (thickness: about 30 nm) may be used. When the three-layer structure is used, tungsten nitride may be used instead of tungsten of the first conductive layer, an alloy layer of aluminum and titanium may be used instead of the alloy layer of aluminum and silicon of the second conductive layer, and a titanium layer may be used instead of the titanium nitride layer of the third conductive layer. For example, when a molybdenum layer is stacked over an Al—Nd alloy layer, a conductive layer which has excellent heat resistance and low electric resistance can be formed.

The gate electrode layer 202 can be formed in such a manner that a conductive layer is formed over the substrate 200 by a sputtering method or a vacuum evaporation method, a mask is formed over the conductive layer by a photolithography method, an inkjet method, or the like, and the conductive layer is etched using the mask. Alternatively, the gate electrode layer 202 may be formed by discharging a conductive nanopaste such as silver, gold, or copper over the substrate by an inkjet method, and then baking the conductive nanopaste. Note that as a barrier metal for increasing adhesion between the gate electrode layer 202 and the substrate 200 and preventing diffusion of a material used for the gate electrode layer 202 to a base, a nitride layer of any of the above-described metal materials may be provided between the substrate 200 and the gate electrode layer 202. In this case, the gate electrode layer 202 is formed by forming the conductive layer over the substrate 200 and etching the conductive layer with a resist mask formed using a photomask.

Note that since a semiconductor layer and a source wiring (a signal line) are formed over the gate electrode layer 202 in later steps, the gate electrode layer 202 is preferably processed to be a tapered shape in order to prevent disconnection at a step portion. In addition, in this step, a gate wiring (a scan line) can be formed at the same time. Further, a capacitor line included in a pixel portion can also be formed. Note that a "scan line" refers to a wiring to select a pixel.

Next, a gate insulating layer is formed to cover the gate electrode layer 202, a crystalline semiconductor layer, an amorphous semiconductor layer, and an impurity semiconductor layer are sequentially stacked over the gate insulating layer. This insulating layer serves as a gate insulating layer and corresponds to the gate insulating layer 204 illustrated in the drawing. Note that at least the gate insulating layer, the crystalline semiconductor layer and the amorphous semiconductor layer are preferably formed successively. More preferably, the impurity semiconductor layer is also formed successively following the above layers. At least the gate insulating layer, the crystalline semiconductor layer and the amorphous semiconductor layer are formed successively without being exposed to air, and thus each interface of layers of the stacked film can be formed without being contaminated by an atmospheric constituent or a contaminant impurity element floating in air. Thus, variation in electric characteristics of thin film transistors can be reduced, and a thin film transistor having high reliability can be manufactured with high yield.

The gate insulating layer 204 can be formed using silicon oxide, silicon nitride, silicon oxynitride, or silicon nitride oxide by a CVD method, a sputtering method, or the like. The gate insulating layer 204 may have either a single-layer structure or a stacked-layer structure of the above-described materials. For example, the gate insulating layer 204 is formed to a thickness of 50 nm or more, preferably greater than or equal to 50 nm and less than or equal to 400 nm, more preferably greater than or equal to 150 nm and less than or equal to 300 nm. When a silicon nitride oxide layer is used as the gate insulating layer 204, alkali metal or the like contained in the substrate 200 can be prevented from entering the crystalline semiconductor layer 206. Alternatively, when a silicon oxynitride layer is used as the gate insulating layer 204, hillocks which can be generated in the case of using aluminum for the gate electrode layer 202 can be prevented and the gate electrode layer 202 can be prevented from being oxidized. The gate insulating layer 204 may be formed using a plasma CVD apparatus with a frequency of greater than or equal to 1 GHz.

After forming the gate insulating layer 204 and before forming the crystalline semiconductor film which is to be the crystalline semiconductor layer 206, a layer for increasing adhesion of the crystalline semiconductor film and preventing the crystalline semiconductor film from being oxidized may be formed over the gate insulating layer 204. As such a layer for preventing oxidation and the like, for example, a stacked layer in which a silicon oxynitride layer is interposed between silicon nitride layers is given.

The crystalline semiconductor layer 206 serves as a channel-formation region of the thin film transistor. A crystalline semiconductor film is formed in the above manner described in Embodiment 1.

Note that the carrier mobility of the crystalline semiconductor layer 206 in this embodiment is about two to twenty times that of the amorphous semiconductor layer. Thus, a thin film transistor formed using a crystalline semiconductor layer has a steep rise in a current-voltage curve where a horizontal axis represents a gate voltage and a vertical axis represents a drain current, compared with a thin film transistor formed using an amorphous semiconductor layer. In this case, a "gate voltage" refers to a potential difference between a source electrode and a gate electrode when the potential of the source electrode is a reference potential, and a "drain current" refers to a current flowing between the source electrode and a drain electrode. Therefore, a thin film transistor using a crystalline semiconductor layer for a channel-formation region is superior in response as a switching element and can operate at high speed. With the use of a thin film transistor whose channel-formation region is formed of a crystalline semiconductor layer as a switching element of a display device, the area of the channel-formation region, that is, the area of the thin film transistor can also be decreased. Further, part or whole of a driver circuit are formed over the same substrate as the pixel portion, and thereby a system-on-panel can also be formed.

Further, the crystalline semiconductor layer 206 often exhibits weak n-type conductivity even when an impurity element for controlling valence electrons is not added to the crystalline semiconductor layer 206. Thus, the threshold voltage $V_{th}$ is preferably controlled by adding an impurity element imparting p-type conductivity (for example, boron) to a crystalline semiconductor layer which functions as a channel-formation region of a thin film transistor at the same time as or after the deposition of the crystalline semiconductor layer. A typical example of an impurity element imparting p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron in the crystalline semiconductor layer may be, for example, $1\times10^{14}$ atoms/cm$^3$ to $6\times10^{16}$ atoms/cm$^3$.

The crystalline semiconductor layer 206 is formed to a thickness of greater than or equal to 2 nm and less than or equal to 60 nm, preferably greater than or equal to 10 nm and less than or equal to 30 nm. When the thickness of the crystalline semiconductor layer is in the range of from 2 nm to 60 nm, a thin film transistor can be made operate as a fully depleted type. The thickness of the crystalline semiconductor layer 206 can be controlled, for example, with the flow rate of silane and the deposition time in a process of forming the crystalline semiconductor film 108, which is described in Embodiment 1.

The amorphous semiconductor layer 208 can be formed using amorphous silicon by a plasma CVD method or the like. Note that the thickness of the amorphous semiconductor layer 208 may be greater than or equal to 10 nm and less than or equal to 500 nm. Alternatively, the amorphous semiconductor layer 208 may be formed by sputtering with hydrogen or a rare gas.

Note that the amorphous semiconductor layer 208 should be formed in such a way that an impurity element imparting one conductivity type, such as phosphorus or boron, is not added to the amorphous semiconductor layer 208. In particular, it is preferable that boron added to the crystalline semiconductor layer 206 for controlling the threshold voltage or phosphorus contained in the source and the drain regions 210 be not mixed into the amorphous semiconductor layer 208. Alternatively, in the case where phosphorus, boron or the like is included in the amorphous semiconductor layer 208, the concentration of phosphorus, boron or the like may be adjusted to be a lower detection limit of secondary ion mass spectrometry or lower. For example, in the case where the crystalline semiconductor layer 206 contains boron and the amorphous semiconductor layer 208 contains phosphorus, a PN junction may be formed between the crystalline semiconductor layer 206 and the amorphous semiconductor layer 208. In addition, in the case where the amorphous semiconductor layer 208 contains boron and the source and the drain regions 210 contain phosphorus, a PN junction may be formed between the amorphous semiconductor layer 208 and the source and the drain regions 210. Alternatively, in the case where the amorphous semiconductor layer 208 contains both boron and phosphorus, a recombination center is generated, which causes leakage current. Accordingly, when the amorphous semiconductor layer 208 does not contain such an impurity element, leakage current can be reduced. When the amorphous semiconductor layer 208 which does not contain an impurity element such as phosphorus or boron is provided between the source and the drain regions 210 and the crystalline semiconductor layer 206, diffusion of the impurity element to the crystalline semiconductor layer 206 serving as a channel-formation region and the source and the drain regions 210 can be prevented.

The amorphous semiconductor layer 208 may contain hydrogen in order to terminate defects in the amorphous semiconductor layer 208.

An amorphous semiconductor has a larger energy gap, higher electric resistance, and lower carrier mobility than a crystalline semiconductor. Therefore, in a thin film transistor to be formed, it is preferable that the amorphous semiconductor layer 208 formed between the source and the drain regions 210 and the crystalline semiconductor layer 206 function as a high-resistant region, and the crystalline semiconductor layer 206 function as a channel-formation region. At this time, since the amorphous semiconductor layer 208 functions as a high-resistance region, an amount of off current can be reduced, and switching characteristics can be improved. When such a thin film transistor is used as a switching element of a liquid crystal display device, the contrast of the liquid crystal display device can be improved.

Note that in the case where the crystalline semiconductor layer 206 is oxidized, field-effect mobility of the thin film transistor is decreased, the subthreshold value thereof is increased, and thus electric characteristics of the thin film transistor are deteriorated (specifically, switching characteristics are deteriorated). However, the amorphous semiconductor layer 208 is provided to cover the surface of the crystalline semiconductor layer 206, and thus crystal grains (especially, the surface thereof) of the crystalline semiconductor layer can be prevented from being oxidized, which leads to suppressing of the deterioration of electric characteristics of the thin film transistor. In the case where hydrogen is contained in the amorphous semiconductor layer 208 (further preferably, fluorine is also contained), oxygen can be effectively prevented from penetrating the amorphous semiconductor layer 208. Thus, oxidation of the crystalline semiconductor layer 206 can be prevented more effectively.

The source and the drain regions 210 can be formed as follows: an impurity semiconductor layer is formed and then etched. In the case where an n-channel thin film transistor is formed as the source and the drain regions 210, typically phosphorus may be added as an impurity element, for example, a gas including an impurity element imparting an n-type conductivity such as $PH_3$ may be added to hydrogenated silicon to form the source and the drain regions 210. In the case where a p-channel thin film transistor is formed, typically boron may be added as an impurity element, for example, a gas including an impurity element imparting a p-type conductivity such as $B_2H_6$ may be added to hydrogenated silicon to form the source and the drain regions 210. The source and the drain regions 210 can be formed using a crystalline semiconductor or an amorphous semiconductor. The source and the drain regions 210 may be formed to a thickness of greater than or equal to 2 nm and less than or equal to 60 nm. That is, the thickness may be the same as the crystalline semiconductor layer 206. When the source and the drain regions 210 are formed with a small thickness, throughput can be improved.

Note that in the present invention, as described above, all layers of from the gate insulating layer to the impurity semiconductor layer are preferably formed successively. With the use of a multi-chamber CVD apparatus, a reaction chamber can be allocated for each different kind of deposition films, and a plurality of different kinds of films can be formed successively without being exposed to air. Hereinafter, an example of a structure of this multi-chamber CVD apparatus is described.

Figure 5:
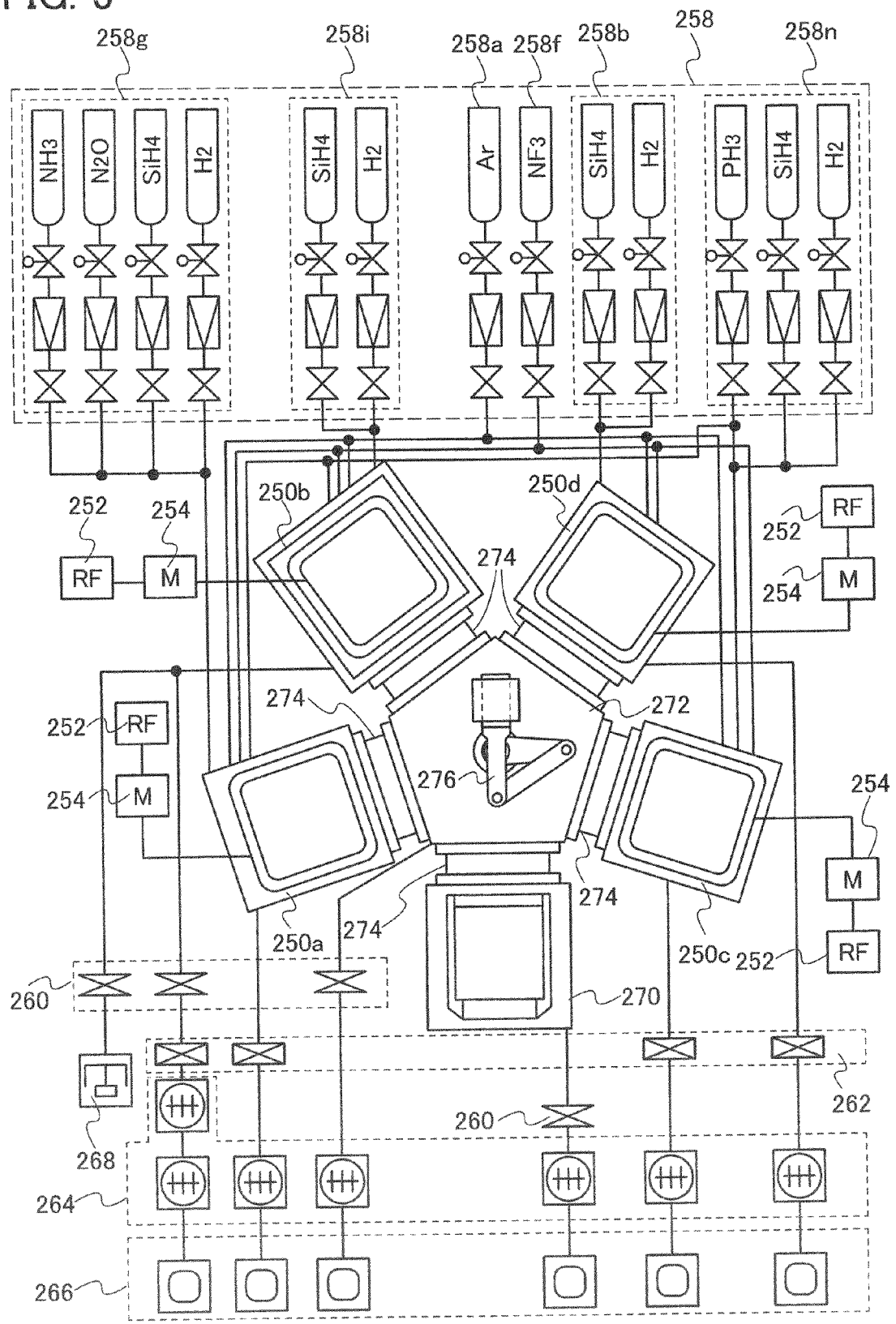
FIG. 5 is a view illustrating a structure of a plasma CVD apparatus.

FIG. 5 schematically illustrates a cross-sectional view from above of an example of a multi-chamber plasma CVD apparatus including a plurality of reaction chambers. This apparatus includes a common chamber 272, a load/unload chamber 270, a first reaction chamber 250a, a second reaction chamber 250b, a third reaction chamber 250c, and a fourth reaction chamber 250d. When a substrate is set in a cassette in the load/unload chamber 270, the substrate 200 is transferred to/from each reaction chamber by a transfer unit 276 in the common chamber 272. Gate valves 274 are provided between the common chamber 272 and each chamber and between the common chamber 272 and the load/unload chamber 270 in order that treatment conducted in the chambers does not interfere with each other. Each reaction chamber can be used for a different purpose, depending on the kind of a thin film to be formed. For example, an insulating film such as a gate insulating film is formed in the first reaction chamber 250a; a semiconductor film containing hydrogen is formed to generate crystal nuclei of a crystalline semiconductor film for a channel formation region in the second reaction chamber 250b; crystal nuclei of a crystalline semiconductor film is grown, and an amorphous semiconductor which protects the crystalline semiconductor film for the channel formation region is formed in the fourth reaction chamber 250d; and a semiconductor layer to which an impurity element imparting one conductivity type and which is to serve as a source region and a drain region is formed in the third reaction chamber 250c. Since each thin film has an optimum temperature for being formed, each thin film is formed in a different reaction chamber, whereby deposition temperatures can be easily controlled and each thin film can be formed at the optimum temperature. Further, the same kind of films can be repeatedly deposited, so that influence of residual impurities attributed to a film formed previously can be excluded. One film may be formed in one reaction chamber, or a plurality of films, for example, the crystalline semiconductor film and the amorphous semiconductor film, may be formed in one reaction chamber.

Turbo molecular pumps 264 and dry pumps 266 are connected to the reaction chambers as evacuation unit. The evacuation unit is not limited to a combination of these vacuum pumps and other vacuum pumps may be employed as long as they can evacuate the reaction chamber to a degree of vacuum of about $10^{-5}$ Pa to $10^{-1}$ Pa. However, a cryopump 268 is preferably connected to the second reaction chamber 250b so that the pressure in the reaction chamber can be reduced to about $10^{-5}$ Pa or less. Either or both of a butterfly valve 260 and a conductance valve 262 are provided between the evacuation unit and the reaction chamber. The butterfly valves 260 can block a path between the evacuation unit and the reaction chambers. Further, the conductance valve 262 can control the pumping speed and adjust the pressure in each process chamber.

Note that the cryopump 268 connected to the second reaction chamber 250b can reduce the pressure in the reaction chamber to less than $10^{-5}$ Pa (preferably, an ultrahigh vacuum). In this embodiment, the pressure in the reaction chamber is reduced to less than $10^{-5}$ Pa, thereby effectively preventing an atmospheric component such as oxygen from entering the crystalline semiconductor film. Consequently, the oxygen concentration in the crystalline semiconductor film can be set to $1 \times 10^{16}$ cm$^{-3}$ or less. When the oxygen concentration in the crystalline semiconductor film is reduced, crystallinity can be increased and the carrier mobility can be improved.

A gas supply unit 258 includes a cylinder filled with a gas used for a deposition process, a stop valve, a mass flow controller, and the like. A gas supply unit 258g is connected to the first reaction chamber 250a and supplies a gas for forming the gate insulating film. A gas supply unit 258i is connected to the second reaction chamber 250b and supplies a gas for forming the crystalline semiconductor film and the amorphous semiconductor film. A gas supply unit 258n is connected to the third reaction chamber 250c and supplies, a deposition gas to which an impurity element imparting for example, n-type conductivity type is added and a dilution gas. Note that an unit which supplies a $PH_3$ gas included in the gas supply unit 258n may be connected to the first reaction chamber 250a. A gas supply unit 258b is connected to the fourth reaction chamber 250d and supplies a gas for forming the crystalline semiconductor film and the amorphous semiconductor film. A gas supply unit 258a supplies argon. A gas supply unit 258f supplies an etching gas (an $NF_3$ gas in this example) used for cleaning in the reaction chambers. The argon gas and the etching gas for cleaning are used in all the reaction chambers, and thus the gas supply unit 258a and the gas supply unit 258f are preferably connected to each reaction chamber.

Further, a high-frequency power supply unit for generating plasma is connected to each reaction chamber. Here, the high-frequency power supply unit includes a high-frequency power source 252 and a matching box 254. For plasma to be generated, for example, RF (13.56 MHz) plasma, VHF (30 MHz to 300 MHz) plasma, or microwave (2.45 GHz) plasma can be used.

Note that pulsed plasma is preferably used here.

Note that in the same reaction chamber, a crystalline semiconductor film, an amorphous semiconductor film, and an impurity semiconductor film to which an impurity element imparting one conductivity type is added may be formed successively. Specifically, a substrate over which a gate insulating film is formed is introduced into a reaction chamber, and in the reaction chamber, the crystalline semiconductor film, the amorphous semiconductor film, and the semiconductor film to which an impurity element imparting one conductivity type is added (an impurity semiconductor film) are formed successively. By forming the crystalline semiconductor film and the amorphous semiconductor film successively in one reaction chamber, an interface with little crystal distortion can be formed. Thus, formation of an unintended level at the interface can be prevented. Further, an atmospheric component (e.g., nitrogen or oxygen) that can enter the interface can be reduced.

A spare chamber may be provided for the apparatus. By heating the substrate in the spare chamber before deposition, it is possible to shorten heating time before the deposition in each reaction chamber, and throughput can be improved.

Further, by forming such layers successively as described above, each layer of stacked films can be formed without interfaces being contaminated by a contaminant impurity element. Thus, variation in electric characteristics of thin film transistors can be reduced.

When the above-mentioned plasma CVD apparatus is used, a film with one kind of composition or films with similar kinds of compositions can be formed in each reaction chamber and can be formed successively without being exposed to air. Therefore, stacked films can be formed without contamination of each interface thereof by a residue of formed films or an impurity element floating in air.

The inside of the reaction chamber of the plasma CVD apparatus is preferably cleaned with fluorine radicals. Further, a protection film is preferably formed in the reaction chamber before the deposition.

Figure 6A:
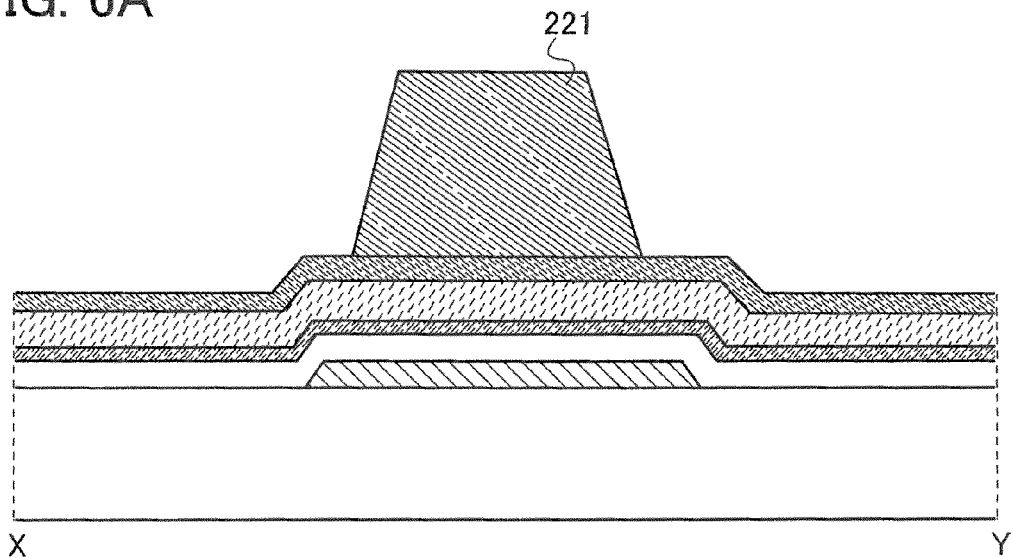
FIGS. 6A to 6C are views illustrating an example of a method for manufacturing a thin film transistor.

Next, a resist mask 221 is formed over the impurity semiconductor layer (see FIG. 6A). The resist mask 221 can be formed by a photolithography method. Alternatively, the resist mask 221 may be formed by an inkjet method or the like.

Figure 6B:
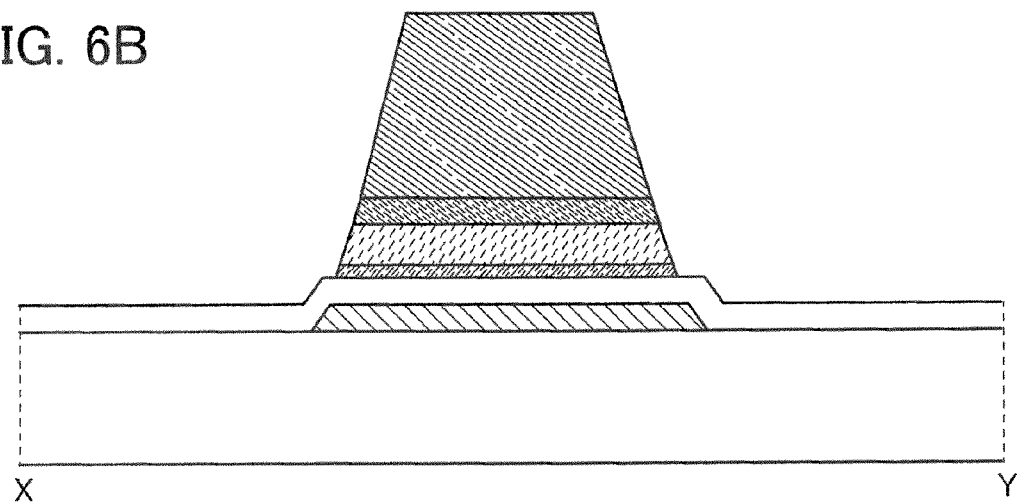

Next, the crystalline semiconductor layer, the amorphous semiconductor layer, and the impurity semiconductor layer are etched using the resist mask 221. By this treatment, the crystalline semiconductor layer, the amorphous semiconductor layer, and the impurity semiconductor layer are separated for each element (see FIG. 6B). After that, the resist mask 221 is removed.

Note that the etching is preferably performed so that a stacked film where the crystalline semiconductor layer, the amorphous semiconductor, and the impurity semiconductor layer are stacked has a tapered shape. The taper angle is from 30° to 90° inclusive, preferably from 40° to 80° inclusive. With the tapered shape, coverage with a layer (e.g., a wiring layer) which is formed thereover in a later step can be improved. Therefore, disconnection or the like caused by a step portion can be prevented.

Figure 6C:
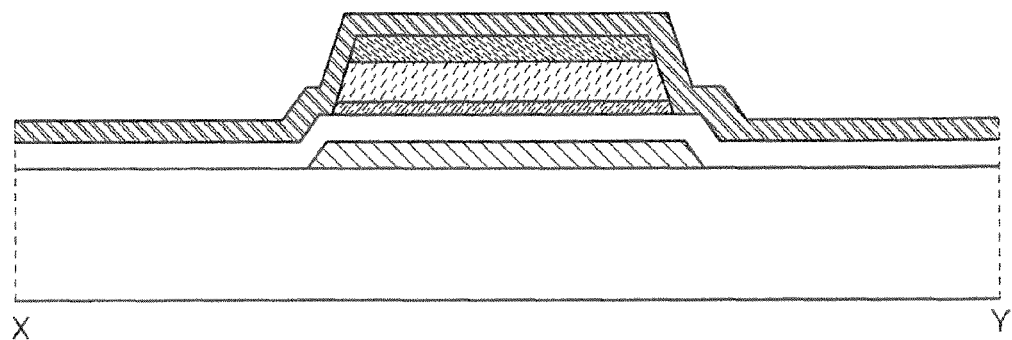

Next, a conductive layer is formed over the impurity semiconductor layer and the gate insulating layer 204 (see FIG. 6C). The conductive layer can be formed of a single-layer structure or a stacked-layer structure of aluminum, copper, titanium, neodymium, scandium, molybdenum, chromium, tantalum, tungsten or/and the like. Alternatively, an aluminum alloy to which an element for preventing a hillock is added (e.g., an Al—Nd alloy which can be used for the gate electrode layer 202) may be used. Further alternatively, crystalline silicon to which an impurity element imparting one conductivity type is added may be used. The conductive layer may have a stacked-layer structure where a layer on the side which is in contact with the impurity semiconductor layer is formed using titanium, tantalum, molybdenum, tungsten, or nitride of any of these elements, and aluminum or an aluminum alloy is formed thereover. Alternatively, the conductive layer may have a stacked-layer structure where aluminum or an aluminum alloy is sandwiched with titanium, tantalum, molybdenum, tungsten, or nitride of any of these elements, on an upper side and a lower side thereof. For example, the conductive layer preferably has a three-layer structure in which an aluminum layer is sandwiched with molybdenum layers.

The conductive layer is formed by a sputtering method, a vacuum evaporation method, or the like. Alternatively, the conductive layer may be formed by discharge of a conductive nanopaste of silver, gold, copper, or the like by using a screen printing method, an inkjet method, or the like and baking the conductive nanopaste.

Figure 7A:
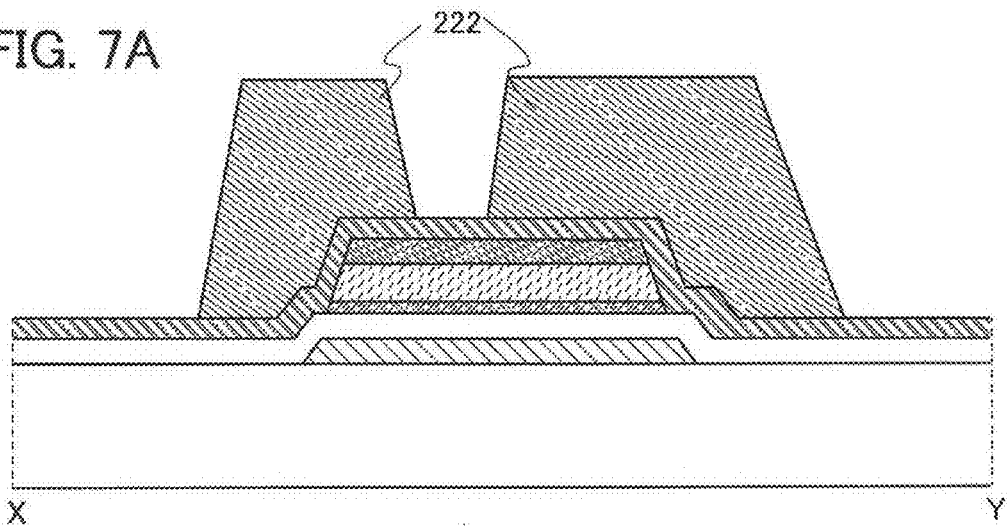
FIGS. 7A to 7C are views illustrating an example of a method for manufacturing a thin film transistor.

Then, a resist mask 222 is formed over the conductive layer (see FIG. 7A). The resist mask 222 is formed by a photolithography method or an inkjet method, in a manner similar to that of the resist mask 221. Here, oxygen plasma asking may be conducted to adjust the size of the resist mask.

Figure 7B:
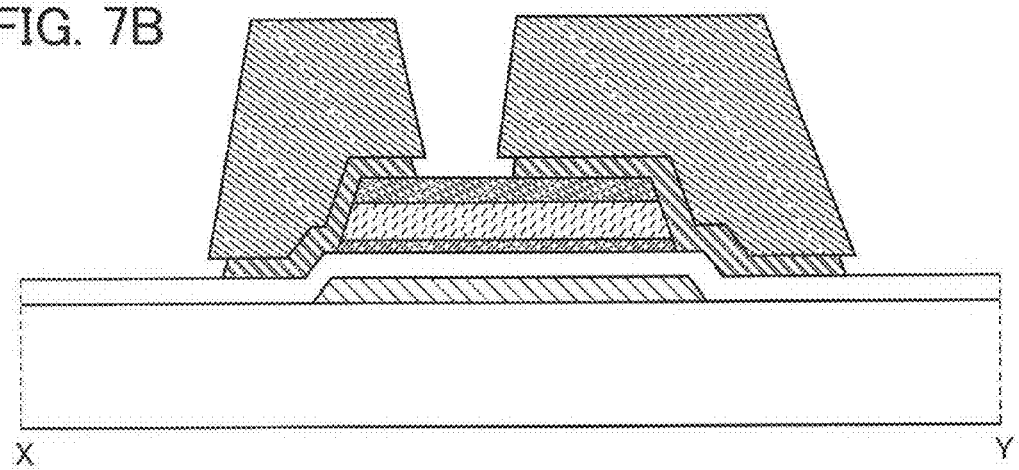

Next, the conductive layer is etched using the resist mask 222 to be patterned (see FIG. 7B). The patterned conductive layers serve as a source and a drain electrodes. The etching is preferably wet etching. By wet etching, a portion which is not covered with the resist mask 222 and exposed of the conductive layer is isotropically etched. As a result, the conductive layer is etched to form the source and the drain electrode layers 212. The source and the drain electrode layers 212 form not only the source electrode and the drain electrode of the thin film transistor but also signal lines.

Figure 7C:
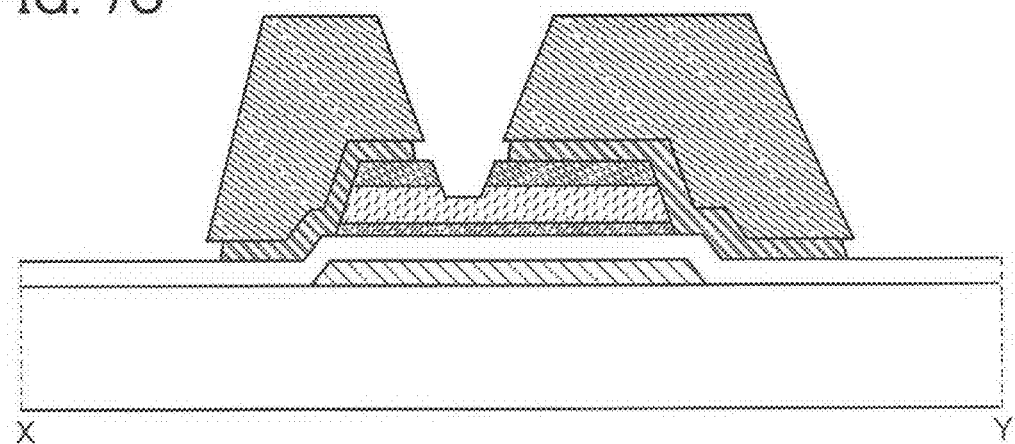

Next, the impurity semiconductor layer and the amorphous semiconductor layer are etched with the resist mask 222 formed thereover to form a back channel portion (see FIG. 7C). By this step, the impurity semiconductor layer is etched and the source and the drain regions 210 are formed. Further, the amorphous semiconductor layer is etched to leave a part thereof and thus the amorphous semiconductor layer 208 is formed.

At this time, dry etching using a gas containing oxygen is conducted as the etching process. By the gas containing oxygen, while the resist is being reduced, the impurity semiconductor layer and the amorphous semiconductor layer can be etched, and whereby the impurity semiconductor layer and the amorphous semiconductor layer can have a tapered shape. As the etching gas, for example, an etching gas in which oxygen is mixed into $CF_4$ or an etching gas in which oxygen is mixed into chlorine is used. The impurity semiconductor layer and the amorphous semiconductor layer have a tapered shape, and thereby electric field concentration can be prevented and off current can be reduced. As an example, the etching can be conducted as follows: with a gas flow ratio of $CF_4:O_2=45:55$ (sccm), a pressure in a chamber of 2.5 Pa, and a temperature of a sidewall in the chamber of 70° C., an RF (13.56 MHz) electric power of 500 W is applied to a coiled electrode to generate plasma, and an RF (13.56 MHz) electric power of 200 W is applied to the substrate side so that negative bias power is substantially applied and self-bias voltage is generated.

The amorphous semiconductor layer 208 has a depressed portion obtained by being partially etched when the source and the drain regions 210 are formed. It is preferable that the thickness of the amorphous semiconductor layer 208 be set so that at least a part of the amorphous semiconductor layer 208 overlapping with the depressed portion is left. Regions of the amorphous semiconductor layer 208 which overlap with the source and the drain regions 210 are not etched in the process of forming the source and the drain regions, and have a thickness of approximately greater than or equal to 80 nm and less than or equal to 500 nm, preferably greater than or equal to 150 nm and less than or equal to 400 nm, and more preferably greater than or equal to 200 nm and less than or equal to 300 nm. By forming the amorphous semiconductor layer 208 with a sufficient thickness as described above, an impurity or the like can be prevented from entering the crystalline semiconductor layer 206. In this manner, the amorphous semiconductor layer 208 also serves as a protective layer for the crystalline semiconductor layer 206.

Figure 8A:
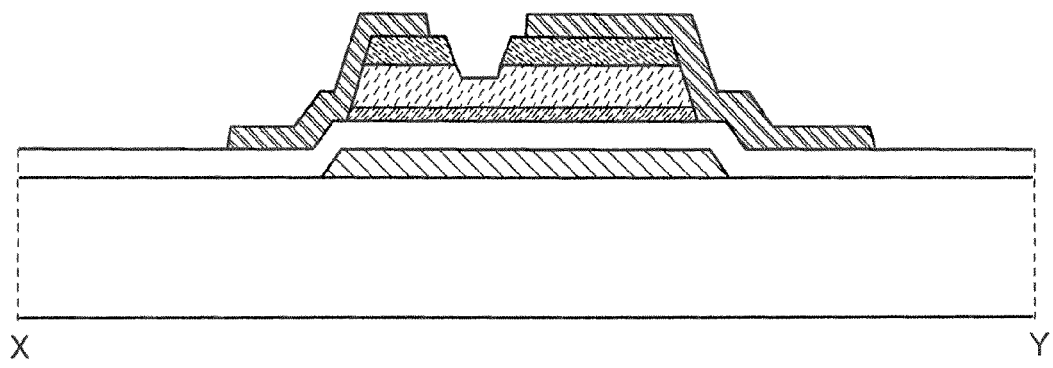
FIGS. 8A and 8B are views illustrating an example of a method for manufacturing a thin film transistor.

Next, the resist mask 222 is removed (see FIG. 8A).

As described above, the amorphous semiconductor layer 208 is provided in the thin film transistor formed using the crystalline semiconductor layer, and thereby an etching residue is prevented from entering the crystalline semiconductor layer 206. However, residual products caused in the etching process, residues of the resist mask, substances which have been used for removal of the resist mask 222 and may be contamination sources in an apparatus, and component substances of a resist-removing solution, or the like are attached or deposited on the amorphous semiconductor layer 208 between the source region and the drain region; thus, by electric conduction through these, off-current increases in many elements, which often leads to variation in electric characteristics between the semiconductor elements over the same substrate.

Therefore, in order to solve the above problem, it is preferable that dry etching be further conducted. By dry etching, insulation between the source region and drain region can be secured. The etching condition is set in which the exposed amorphous semiconductor layer is difficult to damage and an etching rate to the amorphous semiconductor layer is low. In other words, a condition which gives almost no damage to the surface of the exposed region of the amorphous semiconductor layer and does not reduce the thickness of the amorphous semiconductor layer may be applied. At this time, a gas used for forming the back channel portion (e.g., a chlorine gas) can be used as the etching gas. As an example of the etching condition, the etching may be conducted for thirty seconds in the following condition: the flow rate of a gas is 30 sccm, the pressure in a chamber is 0.67 Pa, the temperature of a lower electrode is −10° C. the temperature of the side wall of the chamber is about 80° C., and an RF power (13.56 MHz) of 2000 W is applied to a coiled electrode to generate plasma while no power is applied to a substrate side (i.e., 0 W). There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

The above-described etching can remove residue and the like existing over the amorphous semiconductor layer 208 between the source region and the drain region. It is probable that alkylbenzene sulfonate in the resist removing solution especially increases the leakage current. Therefore, an etching gas which can remove the alkylbenzene sulfonate is preferably used; for example, a nitrogen gas or a $CF_4$ gas is given. This etching process may be performed if needed. Further, after the above etching process, plasma treatment is preferably conducted to the back channel portion.

Through the above process, a channel-etched thin film transistor can be formed.

Figure 8B:
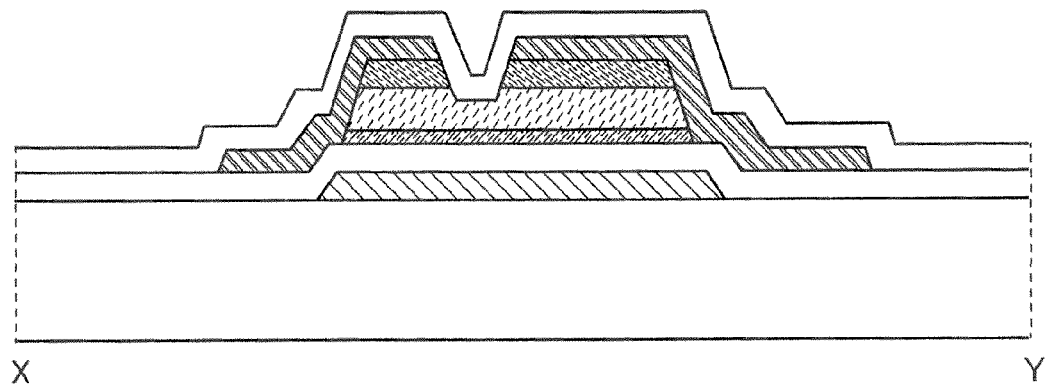

Next, the insulating layer 214 is formed to cover the thin film transistor manufactured in the above manner (see FIG. 8B). Although the insulating layer 214 can be formed in a manner similar to that of the gate insulating layer 204, it is particularly preferable to be formed using silicon nitride. In particular, the insulating layer 214 is preferably a dense silicon nitride layer in order that entry of an impurity which may be contamination sources such as an organic substance, a metal substance, or water vapor floating in the atmosphere can be prevented. Further, it is preferable that the carbon, nitrogen, and oxygen concentrations in the amorphous semiconductor layer 208 be less than or equal to $1\times10^{19}$ atoms/$cm^3$, more preferably less than or equal to $5\times10^{18}$ atoms/$cm^3$.

Note that since the thin film transistor illustrated in FIG. 4 serves as a pixel transistor, one of the source electrode and the drain electrode is connected to the pixel electrode. In the thin film transistor illustrated in FIG. 4, one of the source electrode and the drain electrode is connected to the pixel electrode layer 218 through the opening portion 216 which is provided in the insulating layer 214.

A conductive composition including a conductive high molecule (also referred to as a conductive polymer) having a light-transmitting property can be used for the pixel electrode layer 218. The pixel electrode layer 218 formed using such a conductive composition preferably has a sheet resistance of 10000 Ω/square or less and a light transmittance of 70% or higher at a wavelength of 550 nm. In addition, the resistivity of the conductive high molecule included in the conductive composition is preferably 0.1Ω·cm or less.

As such a conductive high molecule, a so-called π electron conjugated conductive high molecule can be used. For example, polyaniline or a derivative thereof, polypyrrole or a derivative thereof, polythiophene or a derivative thereof, and a copolymer of two or more kinds of these materials are given.

The pixel electrode layer 218 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The pixel electrode layer 218 may be formed in a manner similar to that of the source and the drain electrode layers 212 or the like, in other words, a conductive layer is entirely formed and etched using a resist mask or the like to be patterned.

Although not illustrated, an insulating layer formed using an organic resin by a spin coating method or the like may be present between the insulating layer 214 and the pixel electrode layer 218.

Note that in the above description, the gate electrode and the scan line are formed in the same process and the source and drain electrodes and the signal line are formed in the same process. However, the present invention is not limited to this case. An electrode and a wiring connected to the electrode may be formed in different steps.

In the manner described in this embodiment, a thin film transistor using the crystalline semiconductor layer described in Embodiment 1 can be manufactured. As described in this embodiment, in the thin film transistor, defects can be reduced at an interface between the gate insulating layer and the crystalline semiconductor layer or/and in the gate insulating layer. Therefore, a thin film transistor in which the amount of the threshold voltage shift is small can be manufactured.

Further, the present invention can reduce accumulation of electric charges in the crystalline semiconductor layer and prevent dielectric breakdown of the gate insulating layer.

In the crystalline semiconductor film to which the manufacturing method of the present invention is applied, the crystal grain sizes are large and the uniformity of the grain sizes is high. Therefore, the carrier mobility is high and the on-current is large. Further, the crystalline semiconductor layer in which the grain sizes are large and the uniformity is high can be formed even over a large-area substrate, and thus variation of electric characteristics of thin film transistors in a substrate can be reduced.

Note that the thin film transistor in this embodiment is not limited to that illustrated in FIG. 4. Another thin film transistor in this embodiment, which differs from that in FIG. 4, is illustrated in FIG. 22.

Figure 22:
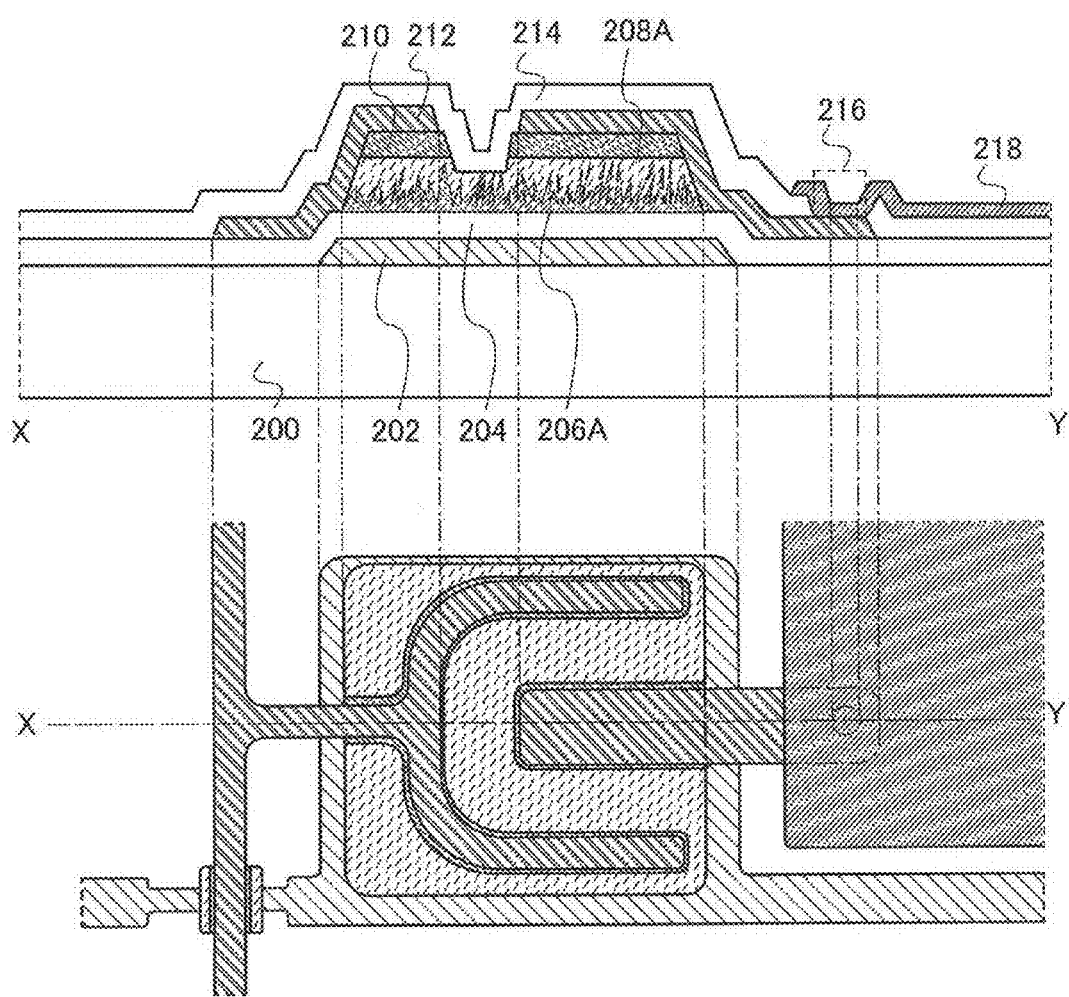
FIG. 22 is a view illustrating an example of a structure of a thin film transistor.

The thin film transistor illustrated in FIG. 22 differs from that in FIG. 4 in that the thin film transistor in FIG. 22 has a first semiconductor layer 206A and a second semiconductor layer 208A instead of the crystalline semiconductor layer 206 and the amorphous semiconductor layer 208.

In FIG. 22, the second semiconductor layer 208A has conical or pyramidal microcrystalline semiconductor regions. Therefore, resistance of the vertical direction (the film thickness direction) of the second semiconductor layer 208A i.e., resistance between the first semiconductor layer 206A and a source region or a drain region, can be lowered, so that on-current of the thin film transistor can be increased.

As in FIG. 22, when the microcrystalline semiconductor region is a crystal region which gets narrower from the gate insulating layer 204 toward the second semiconductor layer 208A (a crystal region having the regular conical or pyramidal shape), the proportion of the crystals at the gate insulating layer 204 side is higher than that of the crystals at the second semiconductor layer 208A side. The microcrystalline semiconductor region grows in the film thickness direction from a surface of the microcrystalline semiconductor film that is formed over the entire surface. At this time, by reducing the flow ratio of hydrogen to silane in a source gas (that is, the dilution ratio is lowered) or by increasing the concentration of nitrogen in the source gas, the generation frequency of crystal nuclei is lowered and the growth of the crystal in which the microcrystalline semiconductor film that is formed over the entire surface is used as a seed crystal is suppressed, whereby the crystal comes to have a conical or pyramidal shape. After that, an amorphous semiconductor is dominantly deposited.

As described above, at the earlier stage of deposition of the semiconductor film which is to be the second semiconductor layer 208A, the semiconductor film which is to be the first semiconductor layer 206A is used as a seed crystal, and a film is deposited on the entire surface (in the earlier stage of deposition).

After that, since the generation frequency of crystal nuclei is lowered as described above to suppress the crystal growth, the crystal nuclei are hardly generated. In the microcrystalline semiconductor region, some crystals are suppressed from growing and some crystals continue growing without being suppressed. As a result, crystals each having a conical or pyramidal shape are formed (in a middle stage of deposition).

Then, the growth of the crystal having a conical or pyramidal shape is suppressed; thus, the second semiconductor layer 208A in which an amorphous semiconductor is dominantly included is formed (in a later stage of deposition).

It is preferable to use nitrogen or a nitride (an NH group or an $NH_2$ group) as an impurity element which reduces the generation frequency of the crystal nuclei and suppresses the crystal growth.

In the crystal region in an amorphous structure of the second semiconductor layer 208A, by controlling the nitrogen concentration which is measured by secondary ion mass spectrometry to $3 \times 10^{20}$ to $1 \times 10^{21}$ $cm^{-3}$, the generation frequency of crystal nuclei is lowered so as not to grow crystal nuclei, and thus, minute crystal grains can be formed.

In a semiconductor layer including the crystal region in the amorphous structure, by controlling the nitrogen concentration which is measured by secondary ion mass spectrometry to greater than or equal to $1 \times 10^{20}$ $cm^{-3}$ and less than or equal to $1 \times 10^{21}$ $cm^{-3}$, preferably greater than or equal to $2 \times 10^{20}$ $cm^{-3}$ and less than or equal to $1 \times 10^{21}$ $cm^{-3}$, crystal nuclei generation positions, from which the conical or pyramidal crystal regions start to grow, and crystal nuclei generation density can be controlled, or crystal growth in the conical or pyramidal crystal regions is controlled.

A "regular conical or pyramidal shape" here refers to a three-dimensional shape which is constructed by (i) a base including a plurality of planes, and (ii) lines linking the periphery of the base and a vertex which is located outside the base, wherein the vertex exists between the base and source and drain regions. That is, a shape whose top gets narrower in a direction in which a film is deposited.

Note that the conical or pyramidal crystal regions include a single crystal or a twin crystal. Note that the "twin crystal" refers to that two crystal grains are bonded to each other with highly favorable consistency at a crystal grain boundary. In other words, crystal lattices are continuously arranged at the crystal grain boundary so that a trap level due to crystal defects or the like is hardly formed at the crystal grain boundary. Thus, the existence of the crystal grain boundary can be substantially negligible in a region having such a crystal structure.

Note that grain sizes of the minute crystal grains are greater than or equal to 1 nm and less than or equal to 10 nm, preferably greater than or equal to 1 nm and less than or equal to 5 nm. As described above, by lowering the generation frequency of the crystal nuclei and suppressing the crystal growth, minute crystal grains can be formed.

Here, a part of the second semiconductor layer 208A which includes the crystal region in an amorphous structure is a semiconductor layer which has an amorphous semiconductor and a minute semiconductor crystal grain. As for the second semiconductor layer including the crystal region in an amorphous structure, the energy at an Urbach edge measured by a constant photocurrent method (CPM) or photoluminescence spectroscopy is low and an amount of absorption spectra of defects is small, compared with a conventional amorphous semiconductor. That is, compared with the conventional amorphous semiconductor, such a semiconductor layer is a well-ordered semiconductor layer which has fewer defects and whose tail slope of a level at a band edge (a mobility edge) in the valence band is steep.

As described above, by providing "the semiconductor layer including a crystal region in an amorphous structure" between channel formation regions and the source and the drain regions, which are illustrated in FIG. 22, resistance in a thickness direction of "the semiconductor layer including a crystal region in an amorphous structure" can be lowered. That is, resistance can be suppressed even when a buffer layer is provided in order to reduce off-current.

In particular, by providing the semiconductor layer including a crystal region in an amorphous structure directly under the source region and the drain region (i.e., in a portion which overlaps with the source region and the drain region in the top view), on-current of the thin film transistor can be increased.

Embodiment 3

In this embodiment, a method for manufacturing a thin film transistor, to which the method for manufacturing the crystalline semiconductor film described in Embodiment 1 is applied, and which differs from the method in Embodiment 2 is described with reference to drawings. Specifically, a method for manufacturing a thin film transistor using a multi-tone mask is described.

Here, a multi-tone mask refers to a mask capable of light exposure with three levels of light intensity to provide an exposed region, a half-exposed region, and an unexposed region. With the use of the multi-tone mask, a resist mask with plural thicknesses (typically, two kinds of thicknesses) can be formed by one-time exposure and development process. Thus, the use of the multi-tone mask can reduce the number of photomasks.

Figures 1, 9A:
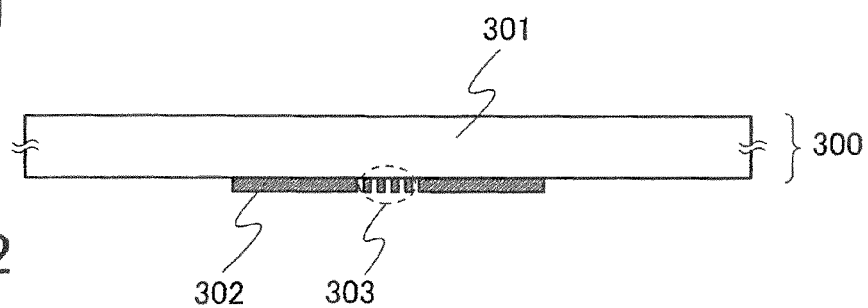
FIGS. 9A-1, 9A-2, 9B-1, and 9B-2 are views illustrating multi-tone masks.
Figures 2, 9A:
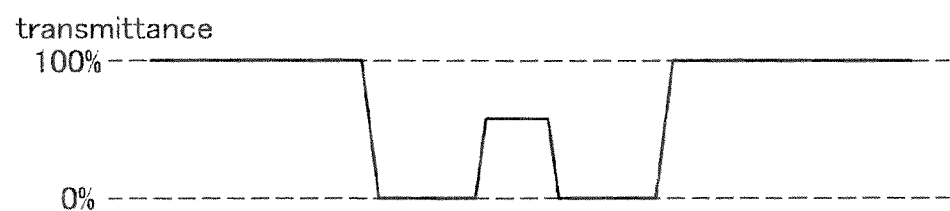
Figures 1, 9B:
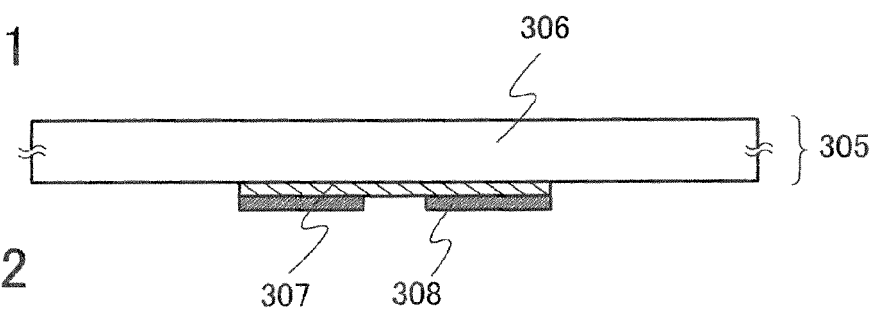
Figures 2, 9B:
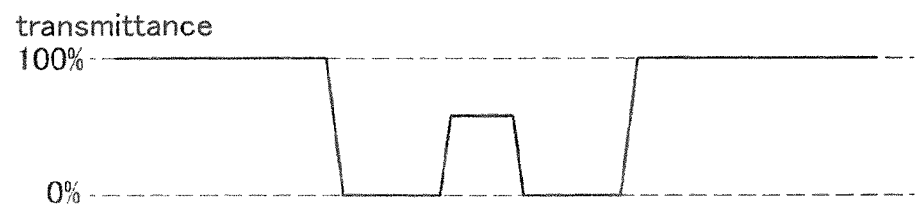

FIG. 9A-1 and FIG. 9B-1 illustrate cross-sectional views of typical multi-tone masks. FIG. 9A-1 illustrates a gray-tone mask 300 and FIG. 9B-1 illustrates a half-tone mask 305.

The gray-tone mask 300 illustrated in FIG. 9A-1 includes a light-blocking portion 302 formed using a light-blocking film on a substrate 301 having a light-transmitting property, and a diffraction grating portion 303 provided with a pattern of the light-blocking film.

At the diffraction grating portion 303, the transmittance of light is controlled in such a manner that slits, dots, mesh, or the like are provided at an interval less than or equal to the resolution limit of light used for light exposure. Note that the slits, dots, or mesh provided at the diffraction grating portion 303 may be provided periodically or non-periodically.

As the substrate 301 having a light-transmitting property, quartz or the like can be used. The light-blocking film for forming the light-blocking portion 302 and the diffraction grating portion 303 may be formed using a metal film, and preferably provided using chromium, chromium oxide, or the like.

In the case where the gray-tone mask 300 is irradiated with light for light exposure, as illustrated in FIG. 9A-2, the transmittance of part of the gray-tone mask 300 which overlaps with the light-blocking portion 302 is 0%, and the transmittance of part of the gray-tone mask 300 where neither the light-blocking portion 302 nor the diffraction grating portion 303 is provided is 100%. Further, the transmittance at the diffraction grating portion 303 can be adjusted approximately in the range of 10% to 70% by the interval of slits, dots, mesh, or the like of the diffraction grating.

The half-tone mask 305 illustrated in FIG. 9B-1 includes a semi-light-transmitting portion 307 formed using a semi-light-transmitting film on a substrate 306 having a light-transmitting property, and a light-blocking portion 308 formed using a light-blocking film.

The semi-light-transmitting portion 307 can be formed using MoSiN, MoSi, MoSiO, MoSiON, CrSi, or the like. The light-blocking portion 308 may be formed using a metal film which is similar to that used for the light-blocking film of the gray-tone mask and preferably provided using chromium, chromium oxide, or the like.

In the case where the half-tone mask 305 is irradiated with light for light exposure, as illustrated in FIG. 9B-2, the transmittance of part of the half-tone mask 305 which overlaps with the light-blocking portion 308 is 0%, and the transmittance of part of the half-tone mask 305 where neither the light-blocking portion 308 nor the semi-light-transmitting portion 307 is provided is 100%. Further, the transmittance in the semi-light-transmitting portion 307 can be adjusted approximately in the range of 10% to 70% by the material forming the semi-light-transmitting portion 307 or the like.

By light exposure and development using the multi-tone mask, a first resist mask which includes regions having different thicknesses can be formed.

Figure 10A:
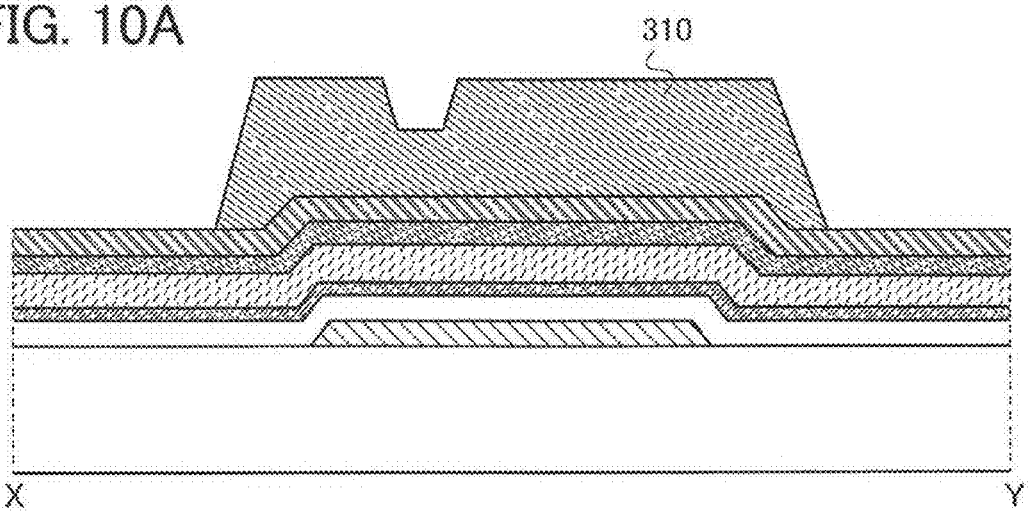
FIGS. 10A to 10C are views illustrating an example of a method for manufacturing a thin film transistor.

First, after the steps up to the formation of the impurity semiconductor layer as in Embodiment 2, a conductive layer is formed over the impurity semiconductor layer to obtain a stacked body without performing etching. Then, a resist mask 310 having a depressed portion at a desired position over the stacked body is formed (see FIG. 10A). The resist mask is formed using the multi-tone mask described above.

Figure 10B:
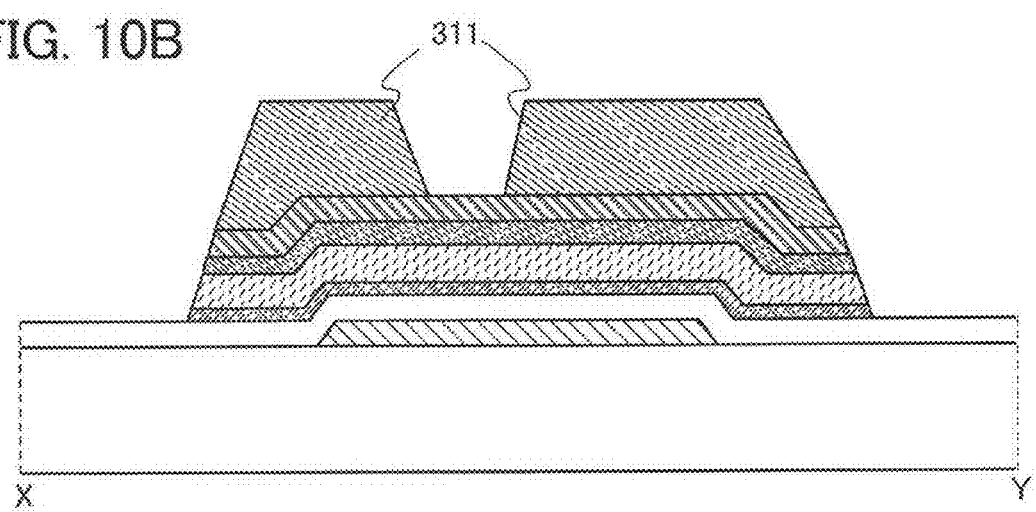

Next, the crystalline semiconductor layer, the amorphous semiconductor layer, the impurity semiconductor layer, and the conductive layer are etched using the resist mask 310. By this etching, the conductive layer under the depressed portion of the resist mask is preferably exposed. In the case where the conductive layer under the depressed portion of the resist mask is not exposed (including the case where wet etching is employed), the size of the resist mask may be adjusted by aching or the like. Note that the etching may be dry etching or wet etching. Thereby a resist mask 311 is formed (see FIG. 10B).

Figure 10C:
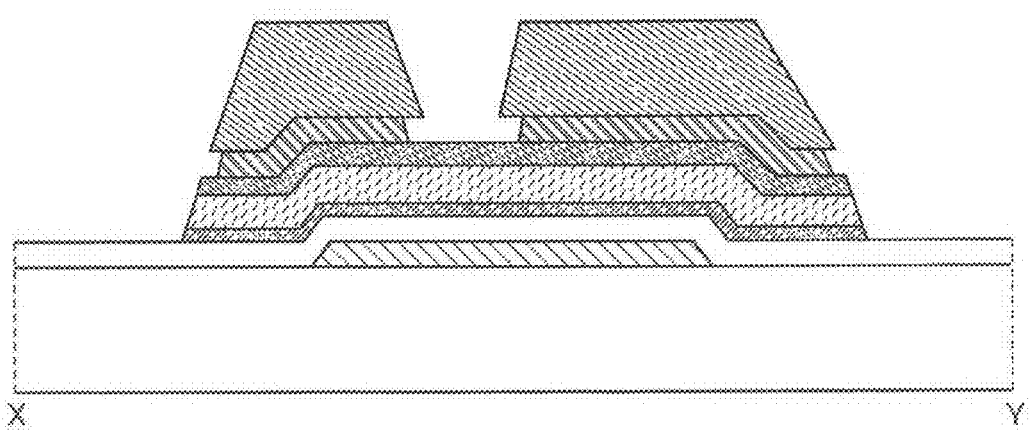

Next, the conductive layer is etched using the resist mask 311 so as to be patterned (see FIG. 10C). The patterned conductive layer serves as a source electrode or a drain electrode. In this case, although dry etching or wet etching may be employed as etching, wet etching is preferably used.

Figure 11A:
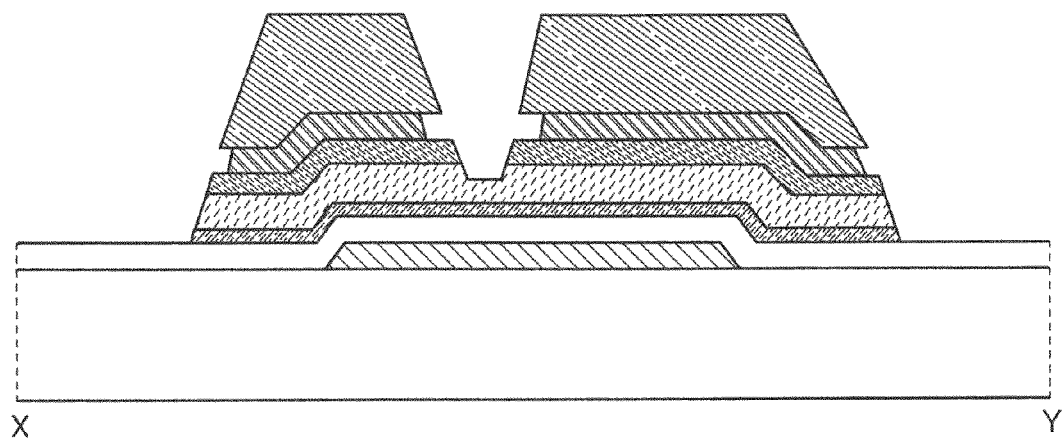
FIGS. 11A and 11B are views illustrating an example of a method for manufacturing a thin film transistor.

Then, the impurity semiconductor layer and the amorphous semiconductor layer are partially etched to separate a source region and a drain region from each other. By this step, the source and the drain regions are formed (see FIG. 11A).

At this time, dry etching using a gas including oxygen may be conducted as the etching. By the gas including oxygen, while the resist is being reduced, the impurity semiconductor layer and the amorphous semiconductor layer can be etched, so that the impurity semiconductor layer and the amorphous semiconductor layer can have a tapered shape. As the etching gas, for example, an etching gas in which oxygen is mixed into $CF_4$ or an etching gas in which oxygen is mixed into chlorine is used. The impurity semiconductor layer and the amorphous semiconductor layer have a tapered shape, and thereby electric field concentration can be prevented and off-current can be reduced.

Figure 11B:
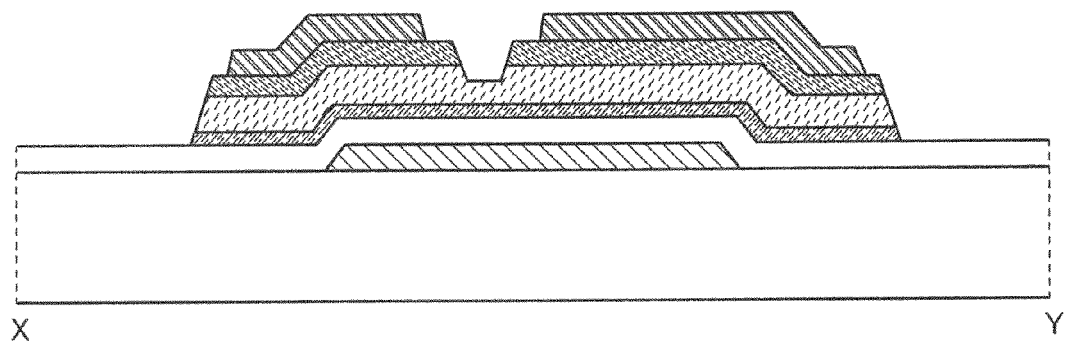

After that the resist mask 311 is removed (see FIG. 11B).

In the manufacturing method in this embodiment, in a manner similar to that in Embodiment 2, it is preferable to perform dry etching in order to reduce leakage current after removing the resist mask 311.

Note that although not illustrated, an insulating layer may be formed to cover the source and the drain electrode layers, the impurity semiconductor layer, and the gate insulating layer, as is formed by another manufacturing method described above. Further, an opening portion may be formed in the insulating layer in order that one of the source and the drain electrodes is connected to a pixel electrode through the opening portion.

Figure 12:
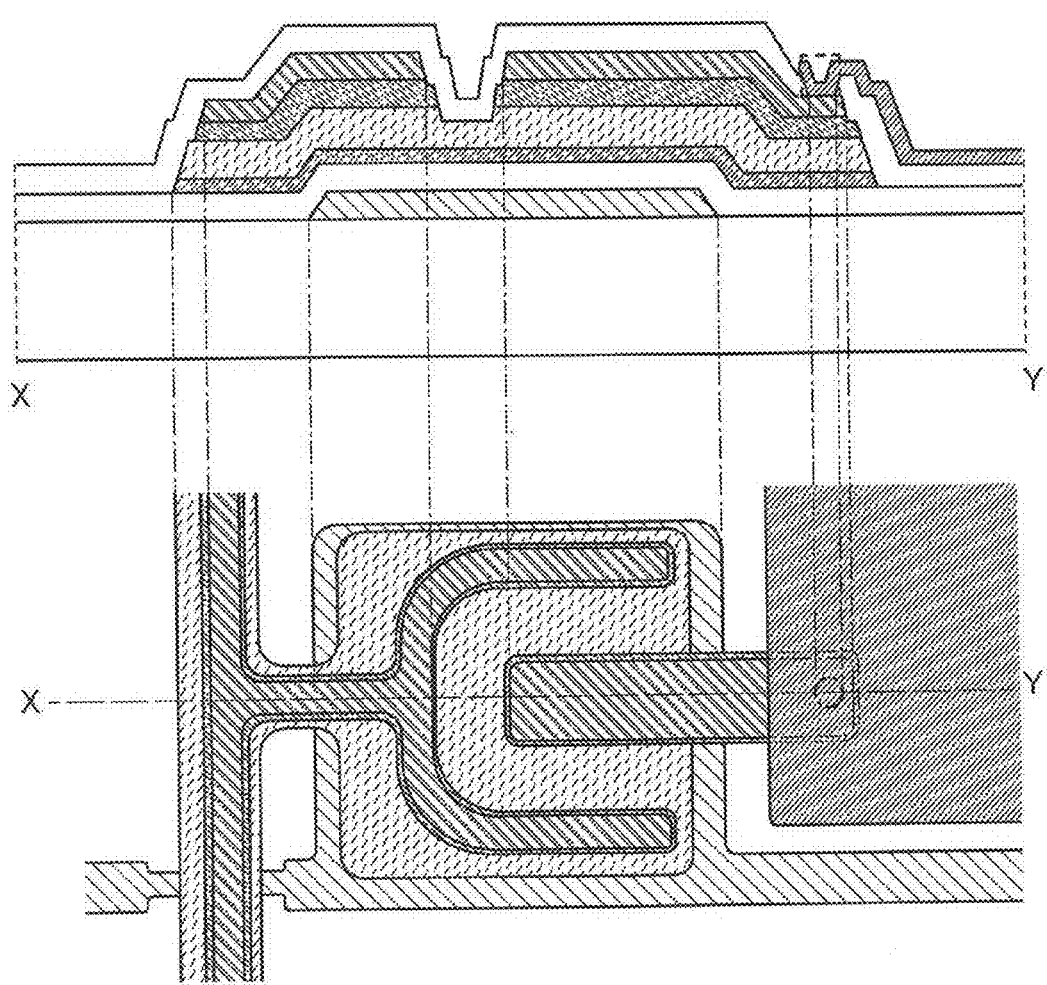
FIG. 12 is a view illustrating an example of a method for manufacturing a thin film transistor.

Note that FIG. 12 illustrates a pixel transistor manufactured in the manner described above. The pixel transistor illustrated in FIG. 12 includes the crystalline semiconductor layer, the amorphous semiconductor layer, and the impurity semiconductor layer under the source and the drain electrodes.

As described above, the multi-tone mask can be used. By the use of the multi-tone mask, the number of steps for manufacturing a thin film transistor can be decreased.

Embodiment 4

Next, one embodiment of a display panel or a light-emitting panel is described with reference to drawings.

In a display device or a light-emitting device according to this embodiment, a signal line driver circuit and a scan line driver circuit, which are connected to a pixel portion, may be formed over a different substrate (for example, a semiconductor substrate or an SOI substrate) and then connected to the pixel portion or may be formed over the same substrate as a pixel circuit.

Note that there is no particular limitation on a connecting method in the case of a different substrate, and a known method such as a COG method, a wire bonding method, or a TAB method can be used. Further, a connecting position is not limited as long as electrical connection is possible. Furthermore, a controller, a CPU, a memory, and/or the like may be fainted separately and connected to the pixel circuit.

Figure 13:
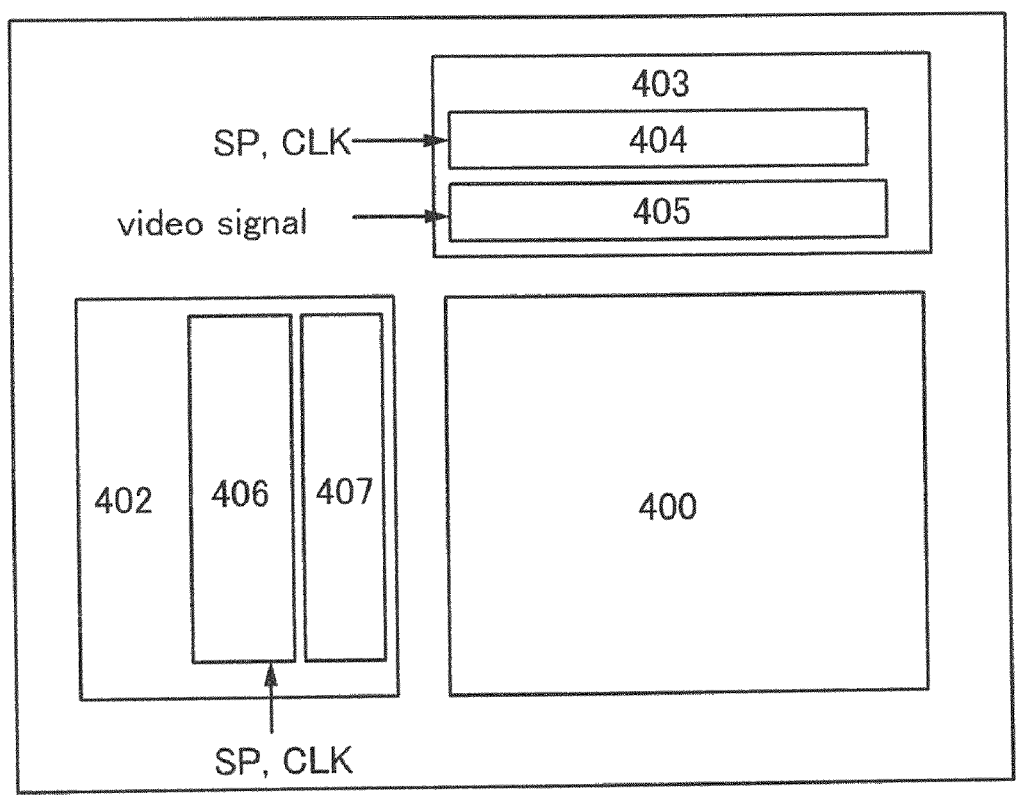
FIG. 13 is a block diagram illustrating a structure of a display device.

FIG. 13 illustrates a block diagram of a display device. The display device illustrated in FIG. 13 includes a pixel portion 400 including a plurality of pixels each provided with a display element, a scan line driver circuit 402 which selects each pixel, and a signal line driver circuit 403 which controls input of a video signal to a selected pixel.

Note that the display device is not limited to the mode illustrated in FIG. 13. That is, the signal line driver circuit is not limited to a mode including only a shift register and an analog switch. In addition to the shift register and the analog switch, another circuit such as a buffer circuit, a level shifter, or a source follower may be included. Further, the shift register and the analog switch are not necessarily provided. For example, another circuit by which a signal line can be selected such as a decoder circuit may be included instead of the shift register, or a latch or the like may be included instead of the analog switch.

The signal line driver circuit 403 illustrated in FIG. 13 includes a shift register 404 and an analog switch 405. A clock signal (CLK) and a start pulse signal (SP) are inputted to the shift register 404. When the clock signal (CLK) and the start pulse signal (SP) are inputted, a timing signal is generated in the shift register 404 and inputted to the analog switch 405.

A video signal is supplied to the analog switch 405. The analog switch 405 samples the video signal in accordance with the timing signal inputted and supplies the sampled signal to a signal line of the next stage.

The scan line driver circuit 402 illustrated in FIG. 13 includes a shift register 406 and a buffer circuit 407. Further, a level shifter may be included. In the scan line driver circuit 402, when the clock signal (CLK) and the start pulse signal (SP) are inputted to the shift register 406, a selection signal is generated. The generated selection signal is buffered and amplified by the buffer circuit 407, and the buffered and amplified signal is supplied to a corresponding scan line. Gates of all pixel transistors of one line are connected to one scan line. Further, because the pixel transistors of one line should be turned on at the same time in the operation, the buffer circuit 407 which can supply a large amount of current is used.

In a full-color display device, when video signals corresponding to R (red), G (green), and B (blue) are sequentially sampled and supplied to corresponding signal lines, the number of terminals for connecting the shift register 404 and the analog switch 405 to each other corresponds to approximately ⅓ of the number of terminals for connecting the analog switch 405 and the signal line of the pixel portion 400 to each other. Accordingly, in comparison to the case where the analog switch 405 and the pixel portion 400 are formed over different substrates, the number of terminals used for connecting to a substrate which is separately formed can be suppressed when the analog switch 405 and the pixel portion 400 are formed over one substrate. Thus, occurrence probability of bad connection can be suppressed and yield can be improved.

Note that although the scan line driver circuit 402 in FIG. 13 includes the shift register 406 and the buffer circuit 407, the present invention is not limited to this. The scan line driver circuit 402 may be formed using only the shift register 406.

Note that the structures of the signal line driver circuit and the scan line driver circuit are not limited to the structure illustrated in FIG. 13, which are merely one mode of the display device.

Figure 15A:
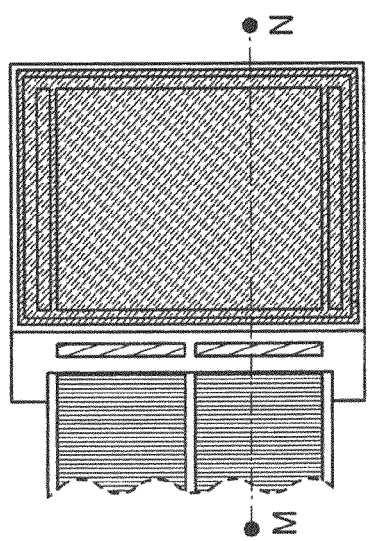
FIGS. 15A and 15B are a top view and a cross-sectional view, respectively, illustrating a light-emitting display panel.
Figure 15B:
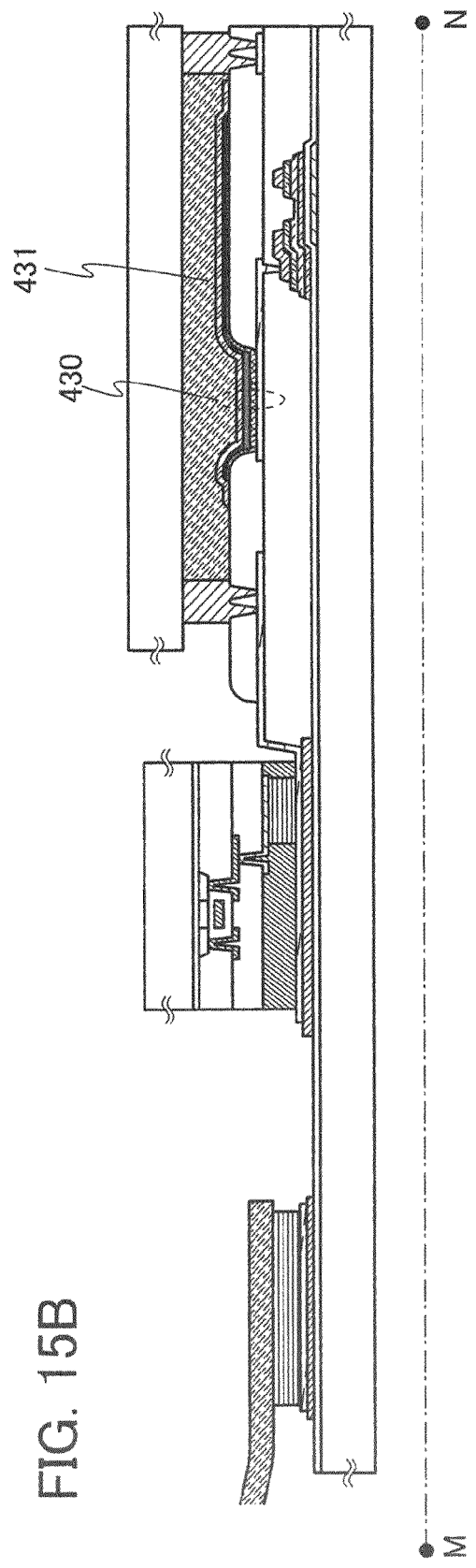

Next, appearances of a liquid crystal display panel, which is one mode of the display device, and a light-emitting panel are described with reference to FIGS. 14A and 14B and FIGS. 15A and 15B. FIG. 14A is a top view of a display panel in which a transistor 420 including a crystalline semiconductor layer and a liquid crystal element 423 which are formed over a first substrate 411 are sealed with a sealant 415 between the first substrate 411 and a second substrate 416. FIG. 14B is a cross-sectional view taken along line K-L in FIG. 14A. FIGS. 15A and 15B illustrate a case of a light-emitting device. In FIGS. 15A and 15B, only portions which are different from FIGS. 14A and 14B are denoted with reference numerals.

The sealant 415 is provided so as to surround a pixel portion 412 and a scan line driver circuit 414 which are provided over the first substrate 411. The second substrate 416 is provided over the pixel portion 412 and the scan line driver circuit 414. Thus, the pixel portion 412 and the scan line driver circuit 414, together with a liquid crystal layer 418 or a filler 431, are sealed with the first substrate 411, the sealant 415, and the second substrate 416. Further, a signal line driver circuit 413 is mounted on a region over the first substrate 411, which is different from the region surrounded by the sealant 415. Note that the signal line driver circuit 413 is formed with a thin film transistor having a crystalline semiconductor layer formed over a separately prepared substrate. Note that although an example in which the signal line driver circuit 413 using a transistor including a crystalline semiconductor layer is attached to the first substrate 411 is described in this embodiment, a signal line driver circuit is preferably formed with a transistor using a single crystal semiconductor and attached. FIG. 14B illustrates a transistor 419 formed using a crystalline semiconductor layer, which is included in the signal line driver circuit 413.

The pixel portion 412 provided over the first substrate 411 includes a plurality of thin film transistors, and in FIG. 14B, a transistor 420 included in the pixel portion 412 is exemplified. In addition, the signal line driver circuit 414 also includes a plurality of thin film transistors, and in FIG. 14B, a transistor 419 included in the signal line driver circuit 414 is exemplified. In the light-emitting device in this embodiment, the transistor 420 may be a driving transistor, a current control transistor, or an erasing transistor. The transistor 420 corresponds to the transistor including a crystalline semiconductor layer described in Embodiment 2 and the like.

In addition, a pixel electrode 422 included in the liquid crystal element 423 is electrically connected to the transistor 420 through a wiring 428. A counter electrode 427 of the liquid crystal element 423 is formed on the second substrate 416. A portion where the pixel electrode 422, the counter electrode 427, and the liquid crystal layer 418 overlap with each other corresponds to the liquid crystal element 423.

A pixel electrode included in a light-emitting element 430 is electrically connected to a source electrode or a drain electrode of the transistor 420 through a wiring. Further, in this embodiment, a common electrode of the light-emitting element 430 and a conductive material layer having a light-transmitting property are electrically connected to each other. Note that the structure of the light-emitting element 430 is not limited to the structure described in this embodiment. The structure of the light-emitting element 430 can be determined in accordance with a direction of light taken from the light-emitting element 430, polarity of the transistor 420, or the like.

The first substrate 411 and the second substrate 416 can be formed using glass, metal (a typical example is stainless steel), ceramics, plastics, or the like. As plastic, a fiberglass-reinforced plastics (FRP) plate, a polyvinyl fluoride (PVF) film, a polyester film, an acrylic resin film, or the like can be used. Further, a sheet in which aluminum foil is sandwiched by PVF films or polyester films may also be used.

A spacer 421 is a bead spacer, and is provided to control a distance (a cell gap) between the pixel electrode 422 and the counter electrode 427. Note that a spacer (a post spacer) which is obtained by selectively etching an insulating layer may also be used.

A variety of signals (potentials) supplied to the signal line driver circuit 413 which is formed separately, the scan line driver circuit 414, and the pixel portion 412 are supplied from an FPC (flexible printed circuit) 417 through a lead wiring 424 and a lead wiring 425.

In this embodiment, a connection terminal 426 is formed using the same conductive layer as the pixel electrode 422 included in the liquid crystal element 423. Further, the lead wiring 424 and the lead wiring 425 are formed using the same conductive layer as the wiring 428.

The connection terminal 426 is electrically connected to a terminal included in the FPC 417 through an anisotropic conductive layer 429.

Although not illustrated, the liquid crystal display device described in this embodiment includes an alignment film and a polarizing plate, and may further include a color filter, a light-shielding layer or the like.

In this embodiment, the connection terminal 426 is formed using the same conductive layer as the pixel electrode included in the light-emitting element 430. Further, the lead wiring 425 is formed using the same conductive layer as the wiring 428. However, the present invention is not limited to this.

As the second substrate located in the direction in which light is extracted from the light-emitting element 430, a light-transmitting substrate is used. In that case, a substrate formed using a light-transmitting material such as a glass plate, a plastic plate, a polyester film, or an acrylic film is used. When light is extracted from the light-emitting element 430 in a direction of the first substrate, a light-transmitting substrate is used as the first substrate.

As the filler 431, an inert gas such as nitrogen or argon, an ultraviolet curable resin, a thermosetting resin, or the like can be used. For example, polyvinyl chloride (PVC), acrylic, polyimide, an epoxy resin, a silicone resin, polyvinyl butyral (PVB), or ethylene vinyl acetate (EVA) can be used. In this case, for example, nitrogen may be used.

An optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer.

Embodiment 5

The invention disclosed in Embodiments 1 to 3 can be applied to a variety of electronic appliances (including game machines). Examples of the electronic appliances include a television set (also referred to as a television or a television receiver), a monitor of a computer, electronic paper, a digital camera, a digital video camera, a digital photo frame, a cellular phone set (also referred to as a cellular phone or a cellular phone device), a portable game machine, a portable information terminal, an audio replay device, a large-sized game machine such as a pachinko machine, or the like.

Figure 16A:
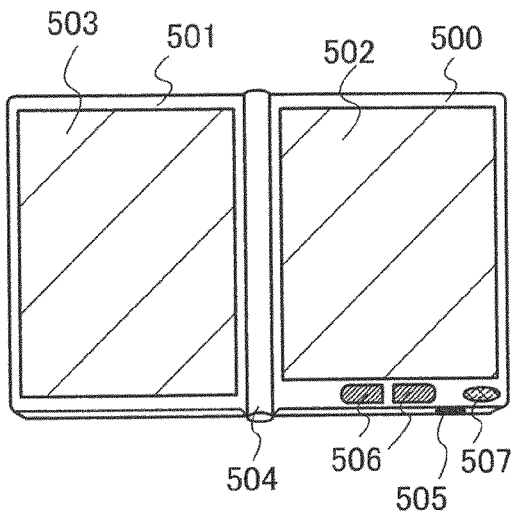
FIGS. 16A to 16D are views each illustrating an electronic appliance including a display device.

The invention disclosed in Embodiments 1 to 3 can be applied to electronic paper, for example. Electronic paper can be used for electronic appliances of a variety of fields as long as they can display data. For example, electronic paper can be used for electronic book devices (e-books), posters, advertisements in vehicles such as trains, display of data on a variety of cards such as credit cards, and so on. FIG. 16A illustrates an example of the electronic appliances.

FIG. 16A illustrates an example of the electronic book devices. The electronic book device illustrated in FIG. 16A includes housings 500 and 501. The housings 500 and 501 are connected with a hinge 504 so that the electronic book device can be opened and closed. With such a structure, the electronic book device can be handled like a paper book.

A display portion 502 and a display portion 503 are incorporated in the housing 500 and the housing 501, respectively. The display portions 502 and 503 may display one image or different images. In the structure where the display portions display different images from each other, for example, the right display portion (the display portion 502 in FIG. 16A) can display text and the left display portion (the display portion 503 in FIG. 16A) can display images. The display device described in Embodiment 4 can be applied to the display portions 502 and 503.

In addition, FIG. 16A illustrates an example in which the housing 500 is provided with an operation portion and the like. For example, the housing 500 is provided with a power input terminal 505, an operation key 506, a speaker 507, and the like. Pages can be turned with the operation key 506, for example. Note that a keyboard, a pointing device, or the like may also be provided on the surface of the housing, on which the display portion is provided. Further, an external connection terminal (an earphone terminal, a USB terminal, a terminal that can be connected to various cables such as a USB cable, or the like), a recording medium insertion portion, and the like may be provided on the back surface or the side surface of the housing. Furthermore, the electronic book device illustrated in FIG. 16A may have a function of an electronic dictionary.

The electronic book device illustrated in FIG. 16A may be configured to transmit and receive data wirelessly. By wireless communication, desired book data or the like can be purchased and downloaded from an electronic book server.

Figure 16B:
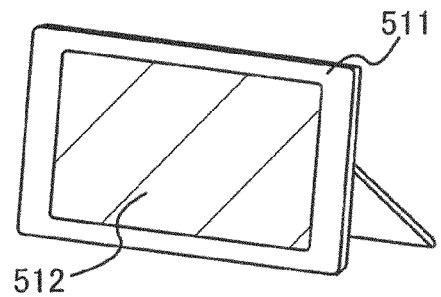

FIG. 16B illustrates an example of a digital photo frame. For example, in the digital photo frame illustrated in FIG. 16B, a display portion 512 is incorporated in a housing 511. The display portion 512 can display various images. For example, the display portion 512 can display data of an image taken with a digital camera or the like to function as a normal photo frame. The display device described in Embodiment 4 can be applied to the display portion 512.

Note that the digital photo frame illustrated in FIG. 16B may be provided with an operation portion, an external connection terminal (a USB terminal, a terminal that can be connected to various cables such as a USB cable, or the like), a recording medium insertion portion, and the like. Although they may be provided on the same surface as the display portion, it is preferable that they be provided on the side surface or the back surface for the design of the digital photo frame. For example, a memory storing data of an image taken with a digital camera is inserted into the recording medium insertion portion of the digital photo frame, whereby the image data can be downloaded and displayed on the display portion 512.

The digital photo frame illustrated in FIG. 16B may be configured to transmit and receive data wirelessly. By wireless communication, desired image data can be imported into the digital photo frame and can be displayed therein.

Figure 16C:
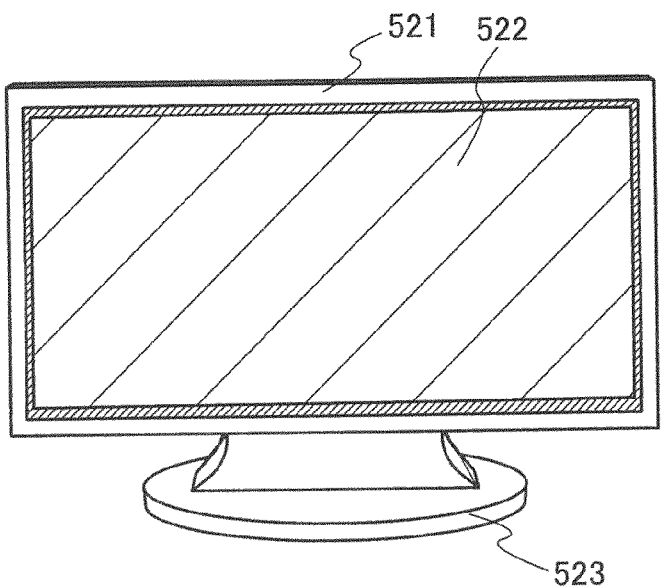

FIG. 16C illustrates an example of a television set. In the television set illustrated in FIG. 16C, a display portion 522 is incorporated in a housing 521. Images can be displayed on the display portion 522. Here, the housing 521 is supported by a stand 523. The display device described in Embodiment 4 can be applied to the display portion 522.

The television set illustrated in FIG. 16C can be operated with an operation switch of the housing 521 or a separate remote controller. Channels and volume can be controlled by an operation key of the remote controller, and an image displayed on the display portion 522 can be controlled. Further, the remote controller may be provided with a display portion for displaying data outputted from the remote controller.

Note that the television set illustrated in FIG. 16C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver, between receivers, or the like) data communication can be performed.

Figure 16D:
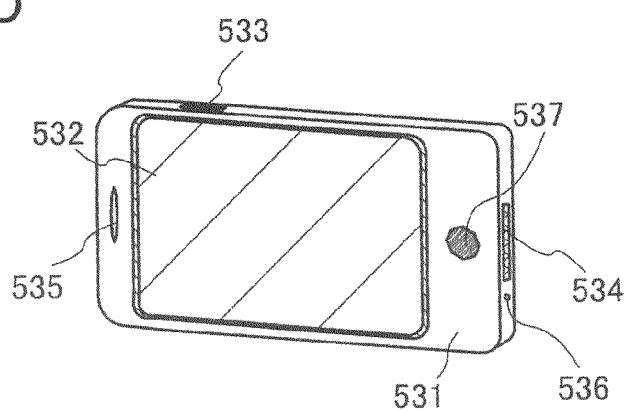

FIG. 16D illustrates an example of a cellular phone set. The cellular phone set illustrated in FIG. 16D is provided with a display portion 532 incorporated in a housing 531, operation buttons 533 and 537, an external connection port 534, a speaker 535, a microphone 536, and the like. The display device described in Embodiment 4 can be applied to the display portion 532.

The display portion 532 of the cellular phone set illustrated in FIG. 16D may be a touch panel. When the display portion 532 is touched with a finger or the like, contents displayed on the display portion 532 can be controlled. In this case, making calls, composing mails, and the like can be performed by touching the display portion 532 with a finger or the like.

There are mainly three screen modes for the display portion 532. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 532 and text displayed on the screen is inputted. In this case, it is preferable to display a keyboard or number buttons on a large area of the screen of the display portion 532.

When a detection device including a sensor for detecting inclination, such as a gyroscope or an acceleration sensor, is provided inside the cellular phone set illustrated in FIG. 16D, display data for the display portion 532 can be automatically switched by determining the orientation of the cellular phone set (whether the cellular phone set is placed horizontally or vertically for a landscape mode or a portrait mode).

The screen modes may be switched by touching the display portion 532 or operating the operation button 537 of the housing 531. Alternatively, the screen modes may be switched depending on the kind of the image displayed on the display portion 532. For example, when a signal of an image displayed on the display portion is the one of moving image data, the screen mode is changed to the display mode. When the signal is the one of text data, the screen mode is changed to the input mode.

Moreover, in the input mode, when input by touching the display portion 532 is not performed for a certain period of time while a signal detected by an optical sensor in the display portion 532 is detected, the screen mode may be controlled so as to be switched from the input mode to the display mode.

The display portion 532 can also function as an image sensor. For example, an image of a palm print, a fingerprint, or the like is taken by the image sensor by touching the display portion 532 with a palm or a finger, whereby personal authentication can be performed. Further, by providing a backlight or a sensing light source emitting a near-infrared light for the display portion, an image of a finger vein, a palm vein, or the like can also be taken.

As described above, the invention disclosed in Embodiments 1 to 3 can be applied to a variety of electronic appliances.

Example 1

In this example, a difference of crystal grain sizes when a period of time of deposition in the first condition is changed is described with reference to SEM (scanning electron microscope) images of crystalline semiconductor films actually formed using the first and the second conditions described in Embodiment 1.

A glass substrate was used as the substrate 100. A silicon oxynitride film of 100 nm was provided as the insulating film 102 over the substrate 100. A crystalline semiconductor film was formed over the silicon oxynitride film.

Formation of the crystalline semiconductor film was conducted by a plasma CVD method using a gas in which a deposition gas is diluted with a hydrogen gas. In this case, a parallel plate plasma CVD apparatus was used. As the deposition gas, silane was used. During deposition, the pressure in a chamber was set to 100 Pa, and a substrate temperature was set to 280° C. Plasma was generated by an RF power supply of 60 MHz, and the electric power was set to 15 W at this time. The distance between an upper electrode and a lower electrode was set to 20 mm.

Figure 17:
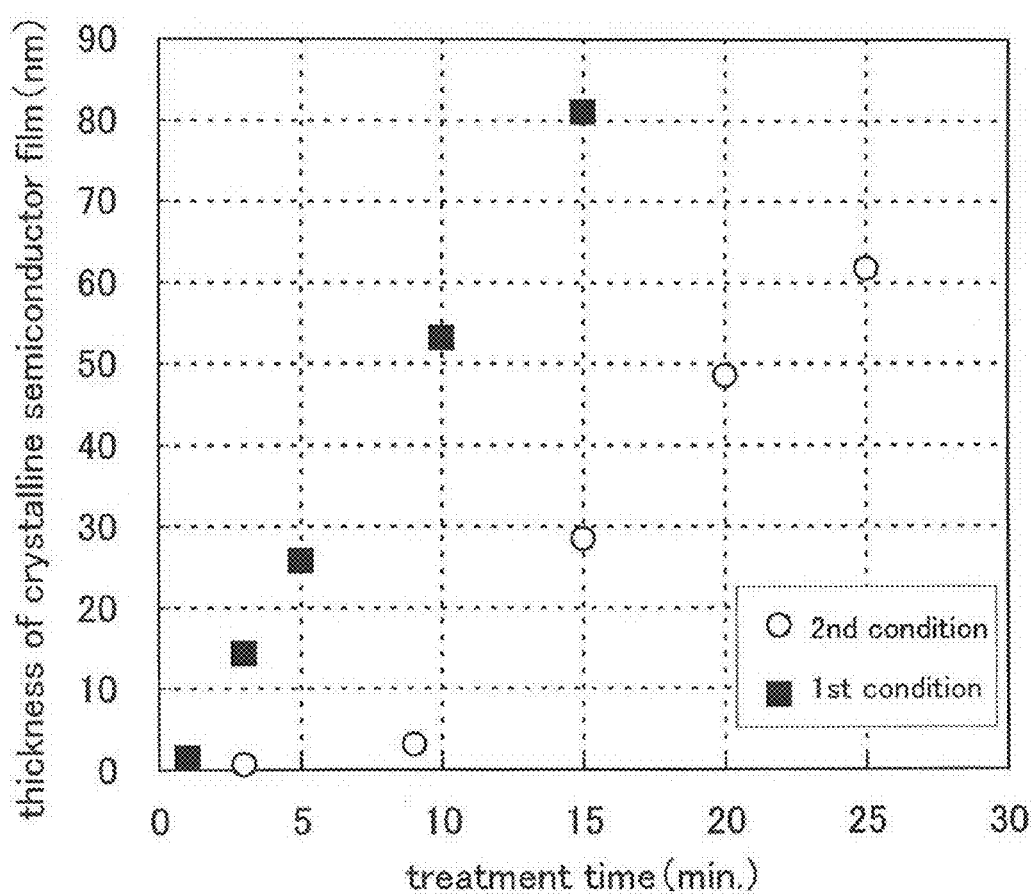
FIG. 17 is a graph illustrating relations between treatment time and a thickness of a crystalline semiconductor film in Example.

First, thicknesses of the crystalline semiconductor films to treatment time are illustrated in FIG. 17 in the case of using the first condition and the case of using the second condition. The thicknesses were measured by a spectroscopic ellipsometry method. FIG. 17 illustrates the thicknesses of the crystalline semiconductor films (a vertical axis) to treatment time (a horizontal axis) in the case of using only the first condition (a condition in which a flow rate of silane was 8 sccm and a flow rate of hydrogen was 400 sccm, a deposition rate during a period of an initial stage of deposition was about $10^{-2}$ nm/sec, the period of an initial stage of deposition was about 1 minute) and in the case of using only the second condition (a condition in which a flow rate of silane was 4 sccm and a flow rate of hydrogen was 400 sccm, a deposition rate during a period of an initial stage of deposition was about $10^{-3}$ nm/sec, the period of an initial stage of deposition was about 5 minutes). When deposition was conducted using only the second condition, it took time for the crystalline semiconductor film to have a certain thickness. On the other hand, when deposition was conducted using only the first condition, the crystalline semiconductor film had a certain thickness soon after treatment had begun. In addition, an increase in thickness of the crystalline semiconductor film versus treatment time is larger in the deposition using only the first condition than in the deposition using only the second condition.

Figure 18A:
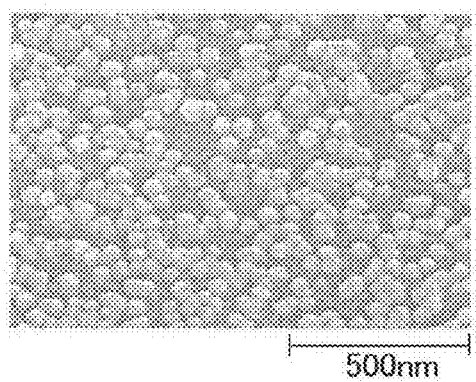
FIGS. 18A to 18D are SEM images of crystalline semiconductor films in Example.
Figure 18B:
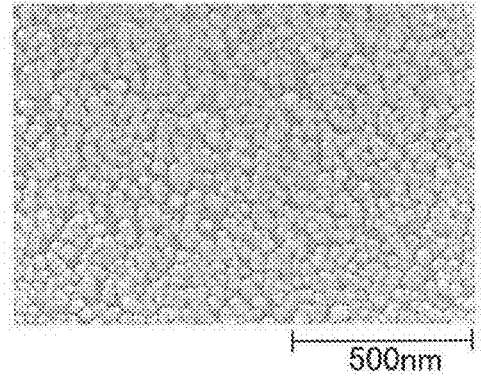
Figure 18C:
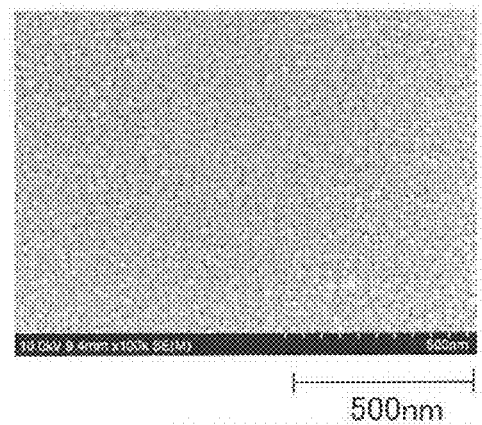
Figure 18D:
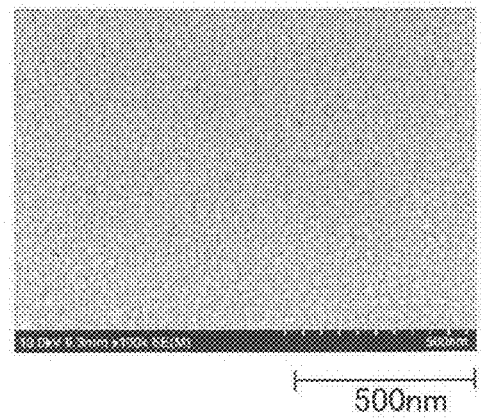

FIGS. 18A to 18D each are an SEM image of a film deposited in a condition where a flow rate of silane and a flow rate of hydrogen were respectively 8 sccm and 400 sccm in the first condition, and a flow rate of silane and a flow rate of hydrogen were respectively 4 sccm and 400 sccm in the second condition. FIG. 18A is an SEM image of a film in the case where treatment time in the first condition was 15 seconds. FIG. 18B is an SEM image of a film in the case where treatment time in the first condition was 20 seconds. FIG. 18C is an SEM image of a film in the case where treatment time in the first condition was 25 seconds. FIG. 18D is an SEM image of a film in the case where treatment time in the first condition was 30 seconds. Note that in all the cases in FIGS. 18A to 18D, treatment time in the second condition was 11 minutes.

Figure 19A:
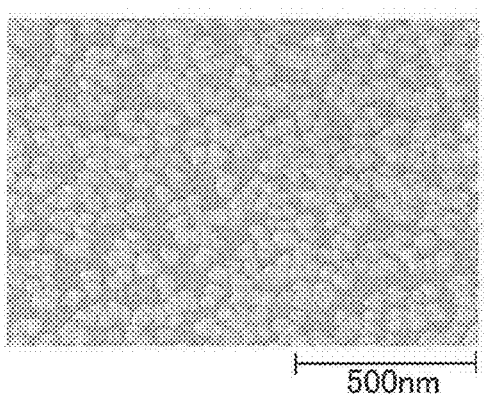
FIGS. 19A to 19D are SEM images of crystalline semiconductor films in Example.
Figure 19B:
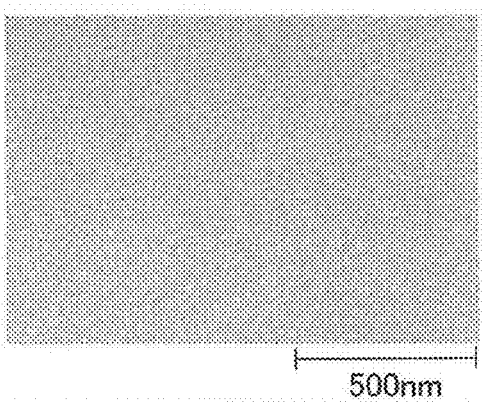
Figure 19C:
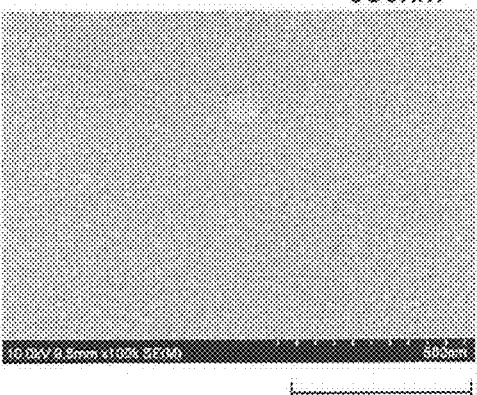
Figure 19D:
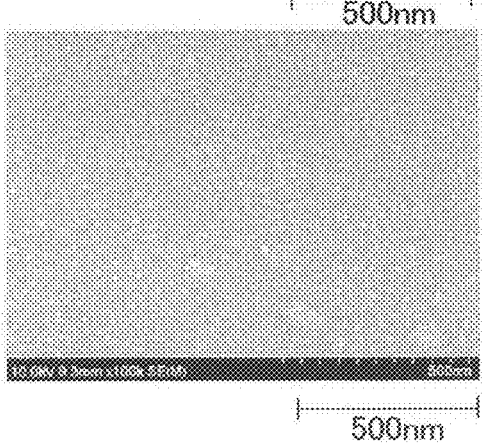

FIGS. 19A to 19D each are SEM images of a film deposited in a condition where a flow rate of silane and a flow rate of hydrogen were respectively 10 sccm and 400 sccm in the first condition, and a flow rate of silane and a flow rate of hydrogen were respectively 4 sccm and 400 sccm in the second condition. FIG. 19A is an SEM image of a film in the case where treatment time in the first condition was 10 seconds. FIG. 19B is an SEM image of a film in the case where treatment time in the first condition was 20 seconds. FIG. 19C is an SEM image of a film in the case where treatment time in the first condition was 30 seconds. FIG. 19D is an SEM image of a film in the case where treatment time in the first condition was 40 seconds. Note that in all the cases in FIGS. 19A to 19D, treatment time in the second condition was 11 minutes.

Figure 20A:
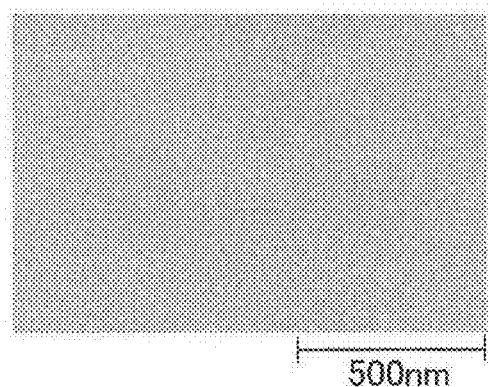
FIGS. 20A, 20C, and 20E are SEM images
Figure 20B:
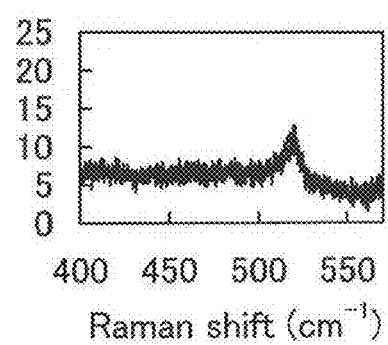
FIGS. 20B, 20D, and 20F are Raman spectra of crystalline semiconductor films in Example.
Figure 20C:
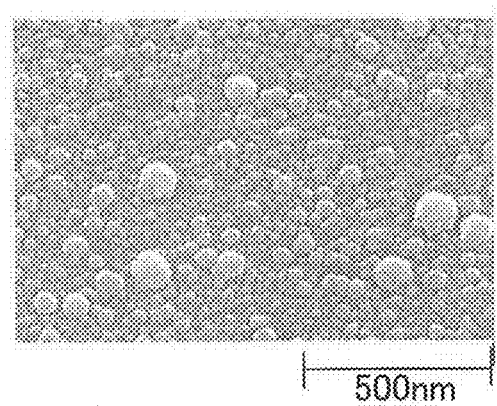
Figure 20D:
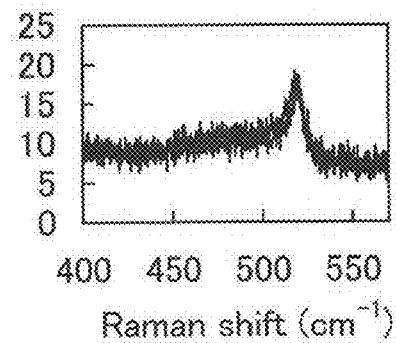
Figure 20E:
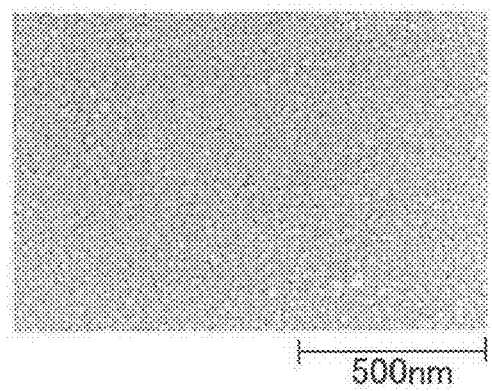
Figure 20F:
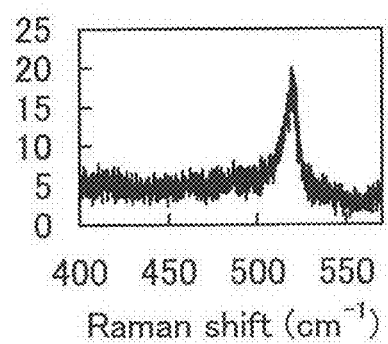

Next, a difference of crystallinity of the crystalline semiconductor film depending on treatment time is clarified with reference to Raman spectrums. FIGS. 20A, 20C, and 20E each illustrate an SEM image and FIGS. 20B, 20D, and 20F each illustrate a Raman spectrum. FIG. 20A shows an SEM image when deposition was conducted for 6 minutes using only the first condition in FIGS. 18A to 18D (a flow rate of silane was 8 sccm) and FIG. 20B shows a Raman spectrum at this time. FIG. 20C shows an SEM image when deposition was conducted for 15 minutes using only the second condition in FIGS. 18A to 18D (a flow rate of silane was 4 sccm) and FIG. 20D shows a Raman spectrum at this time. FIG. 20E shows an SEM image when two-step deposition was conducted, in which treatment in the first condition in FIGS. 18A to 18D (a flow rate of silane was 8 sccm) was conducted for 25 seconds, and treatment in the second condition (a flow rate of silane was 4 sccm) was conducted for 11 minutes, and FIG. 20F shows a Raman spectrum at this time.

According to a Raman spectrum in FIG. 20B, a crystallinity Ic/Ia is 5.25. According to a Raman spectrum in FIG. 20D, a degree of crystallinity Ic/Ia is 3.02. According to a Raman spectrum in FIG. 20F, a degree of crystallinity Ic/Ia is 7.33. Compared with FIG. 20B and FIG. 20D, the degree of crystallinity in FIG. 20F is highest; therefore, the crystallinity is improved by the two-step deposition method described above. Note that Ic is Raman scattering intensity due to a crystalline component and Ia is Raman scattering intensity due to an amorphous component. The uniformity of grain sizes in FIG. 20E is high compared with that of grain sizes in FIG. 20C.

When the SEM images of the case where deposition treatment was conducted solely using either the first condition (FIG. 20A) or the second condition (FIG. 20C) are compared with the SEM images of the case where deposition treatment in the second condition was conducted after deposition treatment in the first condition (FIGS. 18A to 18D and FIGS. 19A to 19D), FIGS. 18A to 18D and FIGS. 19A to 19D are preferable since white portions (crystal portions) in FIGS. 18A to 18D and FIGS. 19A to 19D are large in some extent and uniform in size. By conducting two-step deposition treatment in the manner described above, a crystalline semiconductor film with higher uniformity and larger grain sizes than a crystalline semiconductor film formed by the conventional one-step deposition treatment can be formed.

Figure 21:
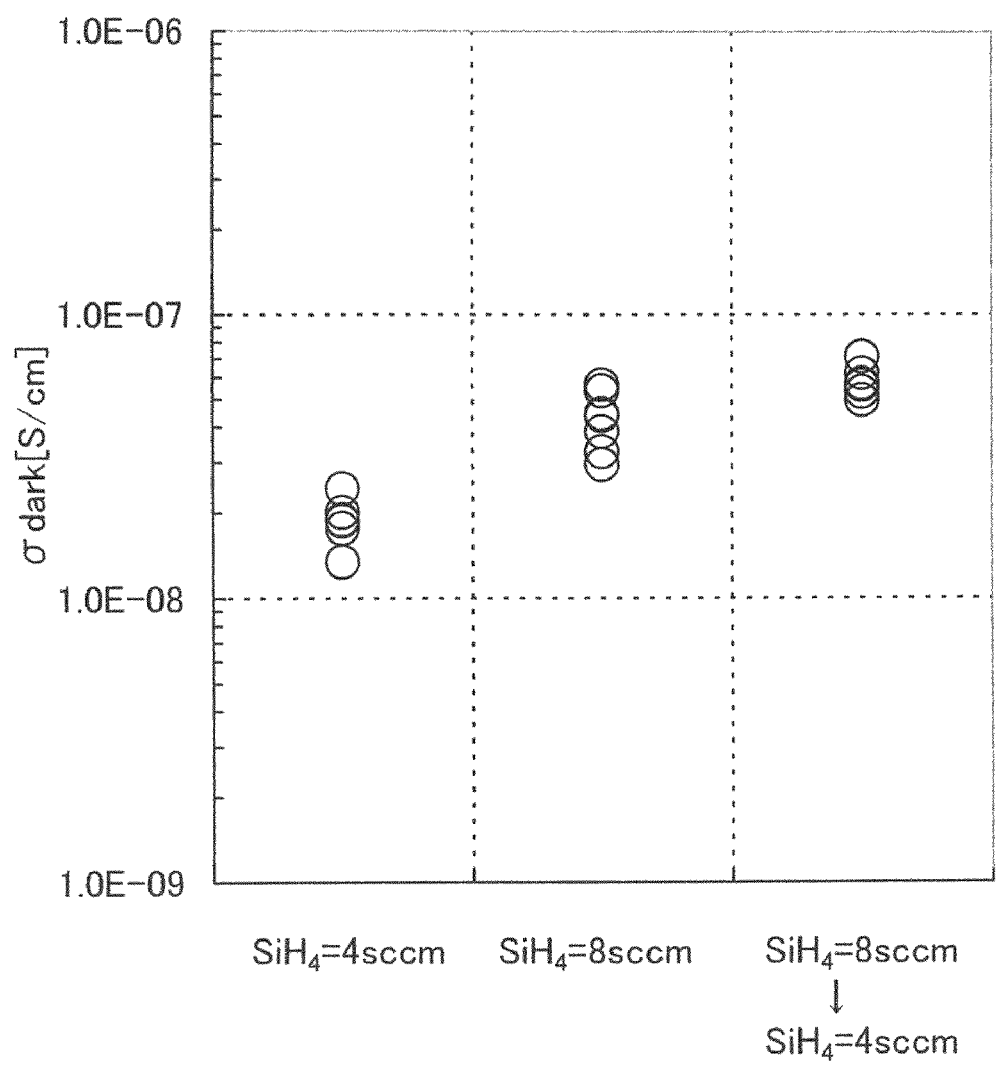
FIG. 21 is a graph illustrating a measurement result of dark currents of crystalline semiconductor films in Example.

FIG. 21 illustrates a measurement result of dark currents $\sigma_{dark}$ of FIG. 20A, FIG. 20C, and FIG. 20E. A dark current is the smallest in the case of deposition using only the second condition (a flow rate of silane was only 4 sccm) as in FIG. 20C. A dark current is the largest in the case where deposition treatment in the second condition was conducted after deposition treatment in the first condition (a flow rate of silane was set to 8 sccm and then 4 sccm) as in FIG. 20E. A dark current is larger in the case of deposition using only the first condition (a flow rate of silane is only 8 sccm) as in FIG. 20A than in the case of deposition using only the second condition, and smaller than in the case where deposition treatment in the second condition was conducted after deposition treatment in the first condition. Therefore, it is probable that the film illustrated in FIG. 20E is a film with a high conductivity and high carrier mobility.

As described above, a crystalline semiconductor film, in which grain sizes and intervals between the crystal grains are uniform, electronic characteristics are favorable, and variation of the electronic characteristics is small, can be formed. This application is based on Japanese Patent Application serial no. 2009-005024 filed with Japan Patent Office on Jan. 13, in 2009, the entire contents of which are hereby incorporated by reference.

What is claimed is:

1. A method for manufacturing a crystalline semiconductor film comprising:
    forming crystal nuclei of a semiconductor over an insulating surface by a plasma CVD method; and
    growing crystals by a plasma CVD method using the crystal nuclei as seeds in a condition where a flow ratio of a dilution gas to a deposition gas is higher than a flow ratio of the dilution gas to the deposition gas in the forming crystal nuclei step.

2. The method for manufacturing a crystalline semiconductor film according to claim 1,
    wherein in the forming crystal nuclei step, the flow ratio of the dilution gas to the deposition gas is greater than or equal to 40:1 and less than or equal to 50:1, and
    wherein in the growing crystals step, the flow ratio of the dilution gas to the deposition gas is greater than or equal to 80:1 and less than or equal to 200:1.

3. A method for manufacturing a crystalline semiconductor film comprising:
    forming crystal nuclei of a semiconductor over an insulating surface by a plasma CVD method; and
    growing crystals by a plasma CVD method using the crystal nuclei as seeds in a condition where a period of an initial stage of deposition is longer than a period of an initial stage of deposition in the forming crystal nuclei step,
    wherein the forming crystal nuclei step is performed in a condition where a deposition rate is greater than or equal to 5 nm/min.

4. The method for manufacturing a crystalline semiconductor film according to claim 3, wherein the period of the initial stage of the deposition is greater than or equal to 1 minute in the forming crystal nuclei step.

5. The method for manufacturing a crystalline semiconductor film according to claim 3, wherein the period of the initial stage of the deposition is greater than or equal to 5 minutes in the growing crystals step.

6. A method for manufacturing a crystalline semiconductor film comprising:
    forming crystal nuclei of a semiconductor over an insulating surface by a plasma CVD method; and
    growing crystals by a plasma CVD method using the crystal nuclei as seeds in a condition where a flow ratio of a dilution gas to a deposition gas is higher than a flow ratio of the dilution gas to the deposition gas in the forming crystal nuclei step,
    wherein the forming crystal nuclei step is performed in a condition where a deposition rate is greater than or equal to 5 nm/min.

7. The method for manufacturing a crystalline semiconductor film according to claim 6, wherein a period of an initial stage of deposition is greater than or equal to 1 minute in the forming crystal nuclei step.

8. The method for manufacturing a crystalline semiconductor film according to claim 6, wherein a period of an initial stage of deposition is greater than or equal to 5 minutes in the growing crystals step.

9. A method for manufacturing a thin film transistor comprising:
   forming a gate electrode;
   forming a gate insulating film to cover the gate electrode;
   forming a crystalline semiconductor film comprising steps of:
      forming crystal nuclei of a semiconductor over the gate insulating film by a plasma CVD method; and
      growing crystals by a plasma CVD method using the crystal nuclei as seeds in a condition where a flow ratio of a dilution gas to a deposition gas is higher than a flow ratio of the dilution gas to the deposition gas in the forming crystal nuclei step; and
   forming a source and a drain regions over the crystalline semiconductor film.

10. The method for manufacturing a thin film transistor according to claim 9,
    wherein in the forming crystal nuclei step, the flow ratio of the dilution gas to the deposition gas is greater than or equal to 40:1 and less than or equal to 50:1, and
    wherein in the growing crystals step, the flow ratio of the dilution gas to the deposition gas is greater than or equal to 80:1 and less than or equal to 200:1.

11. The method for manufacturing a thin film transistor according to claim 9, further comprising an amorphous semiconductor layer between the crystalline semiconductor film and the source and the drain regions.

12. The method for manufacturing a thin film transistor according to claim 9, further comprising a semiconductor layer including a microcrystalline semiconductor region having a conical or pyramidal shape between the crystalline semiconductor film and the source and the drain regions.

13. A method for manufacturing a thin film transistor comprising:
    forming a gate electrode;
    forming a gate insulating film to cover the gate electrode;
    forming a crystalline semiconductor film comprising steps of:
       forming crystal nuclei of a semiconductor over the gate insulating film by a plasma CVD method; and
       growing crystals by a plasma CVD method using the crystal nuclei as seeds in a condition where a period of an initial stage of deposition is longer than a period of an initial stage of deposition in the forming crystal nuclei step; and
    forming a source and a drain regions over the crystalline semiconductor film,
    wherein the forming crystal nuclei step is performed in a condition where a deposition rate is greater than or equal to 5 nm/min.

14. The method for manufacturing a thin film transistor according to claim 13, wherein the period of the initial stage of the deposition is greater than or equal to 1 minute in the forming crystal nuclei step.

15. The method for manufacturing a thin film transistor according to claim 13, wherein the period of the initial stage of the deposition is greater than or equal to 5 minutes in the growing crystals step.

16. The method for manufacturing a thin film transistor according to claim 13, further comprising an amorphous semiconductor layer between the crystalline semiconductor film and the source and the drain regions.

17. The method for manufacturing a thin film transistor according to claim 13, further comprising a semiconductor layer including a microcrystalline semiconductor region having a conical or pyramidal shape between the crystalline semiconductor film and the source and the drain regions.

18. A method for manufacturing a thin film transistor comprising:
    forming a gate electrode;
    forming a gate insulating film to cover the gate electrode;
    forming a crystalline semiconductor film comprising steps of:
       forming crystal nuclei of a semiconductor over the gate insulating film by a plasma CVD method; and
       growing crystals by a plasma CVD method using the crystal nuclei as seeds in a condition where a flow ratio of a dilution gas to a deposition gas is higher than a flow ratio of the dilution gas to the deposition gas in the forming crystal nuclei step; and
    forming a source and a drain regions over the crystalline semiconductor film,
    wherein the forming crystal nuclei step is performed in a condition where a deposition rate is greater than or equal to 5 nm/min.

19. The method for manufacturing a thin film transistor according to claim 18, wherein a period of an initial stage of deposition is greater than or equal to 1 minute in the forming crystal nuclei step.

20. The method for manufacturing a thin film transistor according to claim 18, wherein a period of an initial stage of deposition is greater than or equal to 5 minutes in the growing crystals step.

21. The method for manufacturing a thin film transistor according to claim 18, further comprising an amorphous semiconductor layer between the crystalline semiconductor film and the source and the drain regions.

22. The method for manufacturing a thin film transistor according to claim 18, further comprising a semiconductor layer including a microcrystalline semiconductor region having a conical or pyramidal shape between the crystalline semiconductor film and the source and the drain regions.

* * * * *

UNITED STATES PATENT AND TRADEMARK OFFICE
CERTIFICATE OF CORRECTION

PATENT NO. : 7,989,325 B2
APPLICATION NO. : 12/646373
DATED : August 2, 2011
INVENTOR(S) : Tomokazu Yokoi et al.

It is certified that error appears in the above-identified patent and that said Letters Patent is hereby corrected as shown below:

column 7, lines 6, "1241" should read "124I"

column 16, line 7, "asking" should read "ashing"

column 17, lines 31 "." should read ","

column 22, line 3, "aching" should read "ashing"

column 22, line 67, "fainted" should read "formed"

column 25, line 31, "ease" should read "case"

column 29, line 15, "eases" should read "cases"

Signed and Sealed this
Twenty-fifth Day of October, 2011

David J. Kappos
*Director of the United States Patent and Trademark Office*